(12) United States Patent
Miyata et al.

(10) Patent No.: US 12,532,438 B2
(45) Date of Patent: Jan. 20, 2026

(54) ON-BOARD DEVICE

(71) Applicant: Mitsubishi Electric Corporation, Tokyo (JP)

(72) Inventors: Yuki Miyata, Tokyo (JP); Hiroyuki Ushifusa, Tokyo (JP); Toru Yamada, Tokyo (JP); Hirokazu Takabayashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 140 days.

(21) Appl. No.: 18/565,110

(22) PCT Filed: Jul. 27, 2021

(86) PCT No.: PCT/JP2021/027745
§ 371 (c)(1),
(2) Date: Nov. 29, 2023

(87) PCT Pub. No.: WO2023/007587
PCT Pub. Date: Feb. 2, 2023

(65) Prior Publication Data
US 2024/0298427 A1    Sep. 5, 2024

(51) Int. Cl.
*H05K 7/20* (2006.01)
*B61C 17/00* (2006.01)
*F28F 13/12* (2006.01)

(52) U.S. Cl.
CPC .......... *H05K 7/2089* (2013.01); *B61C 17/00* (2013.01); *F28F 13/12* (2013.01)

(58) Field of Classification Search
CPC .......... H05K 7/20; H05K 7/2089; F28F 13/12; B61C 17/00; Y02T 30/00
See application file for complete search history.

(56) References Cited

U.S. PATENT DOCUMENTS

2008/0023188 A1 *  1/2008  Harman .................. F24V 99/00
                                                          165/181

FOREIGN PATENT DOCUMENTS

| EP | 3882935 A1 | 9/2021 |
|----|-----------|--------|
| JP | S5826669 A | 2/1983 |

(Continued)

OTHER PUBLICATIONS

International Search Report (PCT/ISA/210) with translation and Written Opinion mailed on Oct. 12, 2021, by the Japan Patent Office as the International Searching Authority for International Patent Application No. PCT/JP2021/027745. (12 pages).

*Primary Examiner* — Harry E Arant
(74) *Attorney, Agent, or Firm* — BUCHANAN, INGERSOLL & ROONEY PC

(57) ABSTRACT

An in-vehicle device includes a housing, one or more coolers, and one or more turbulence generating members. The housing is attachable to a railway vehicle and accommodates an electronic component that generates heat. The one or more coolers are attached to and located outside the housing, with the one or more coolers thermally connected to the electronic component, to dissipate heat transferred from the electronic component to passing air occurring when the railway vehicle travels. The one or more turbulence generating members are located on a flow path of the passing air to cause turbulence by partly interrupting a flow of the passing air flowing to the at least one cooler.

18 Claims, 26 Drawing Sheets

(56) References Cited

FOREIGN PATENT DOCUMENTS

| JP | 2000092819 | A | * | 3/2000 | ......... H05K 7/20918 |
|----|------------|---|---|--------|------------------------|
| JP | 2011151924 | A |   | 8/2011 |                        |
| JP | 2013178018 | A |   | 9/2013 |                        |
| JP | 2013190147 | A |   | 9/2013 |                        |
| JP | 2018043611 | A |   | 3/2018 |                        |
| JP | 2022109866 | A | * | 7/2022 |                        |
| WO | 2020100247 | A1 |  | 5/2020 |                        |

* cited by examiner

FIG.2
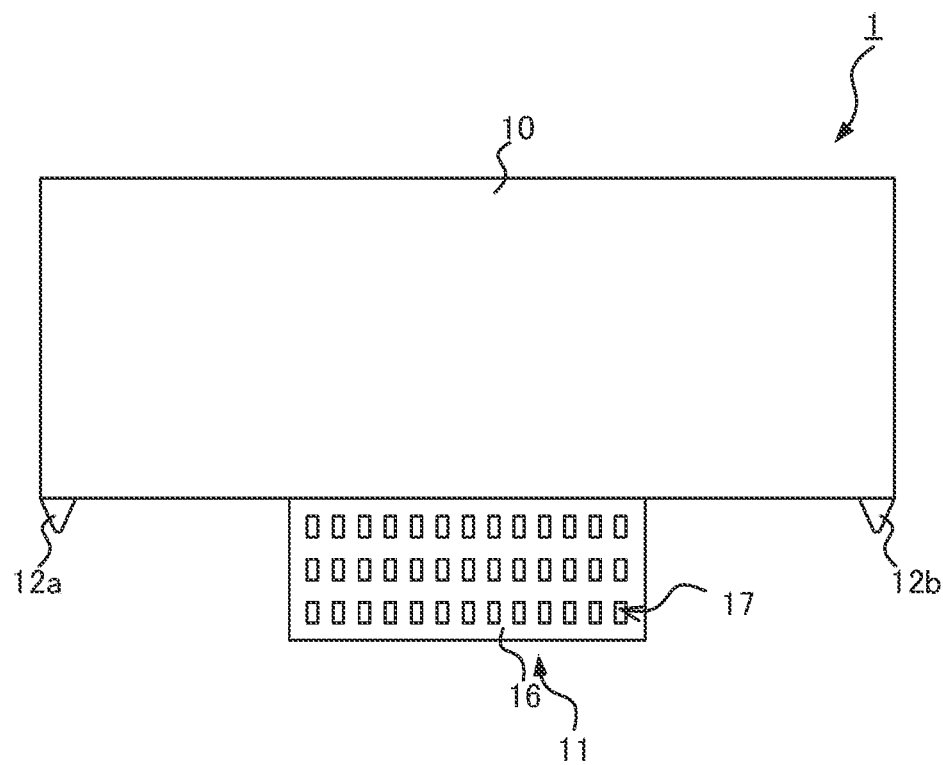
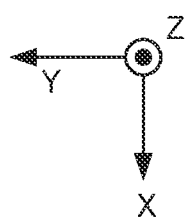

FIG.4
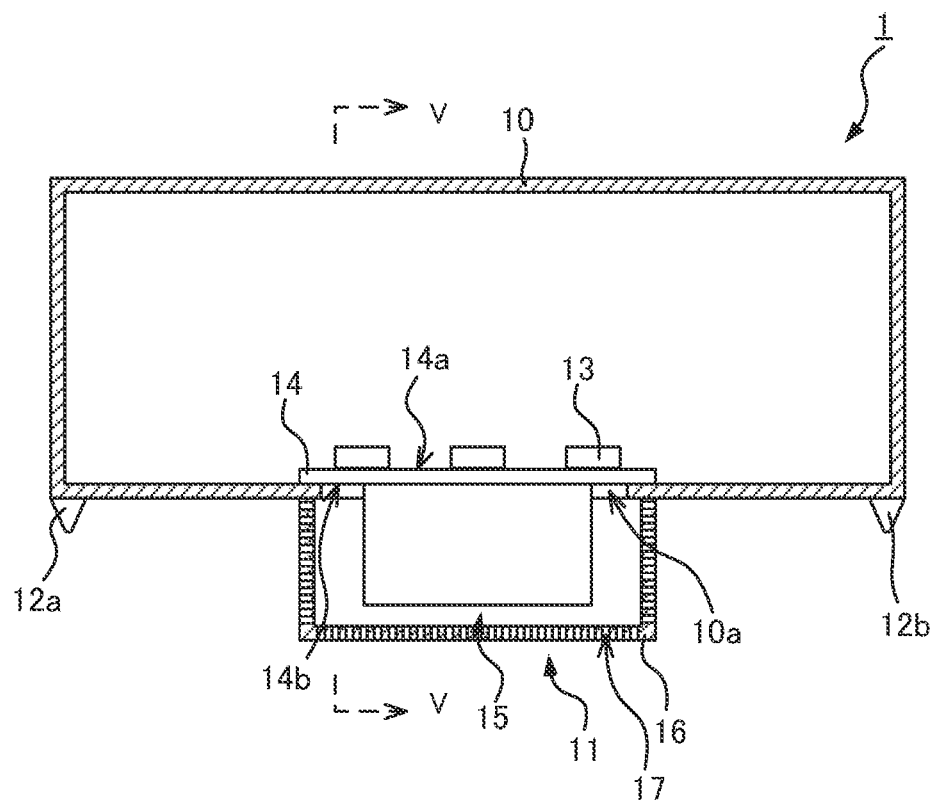
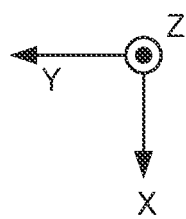

FIG.6
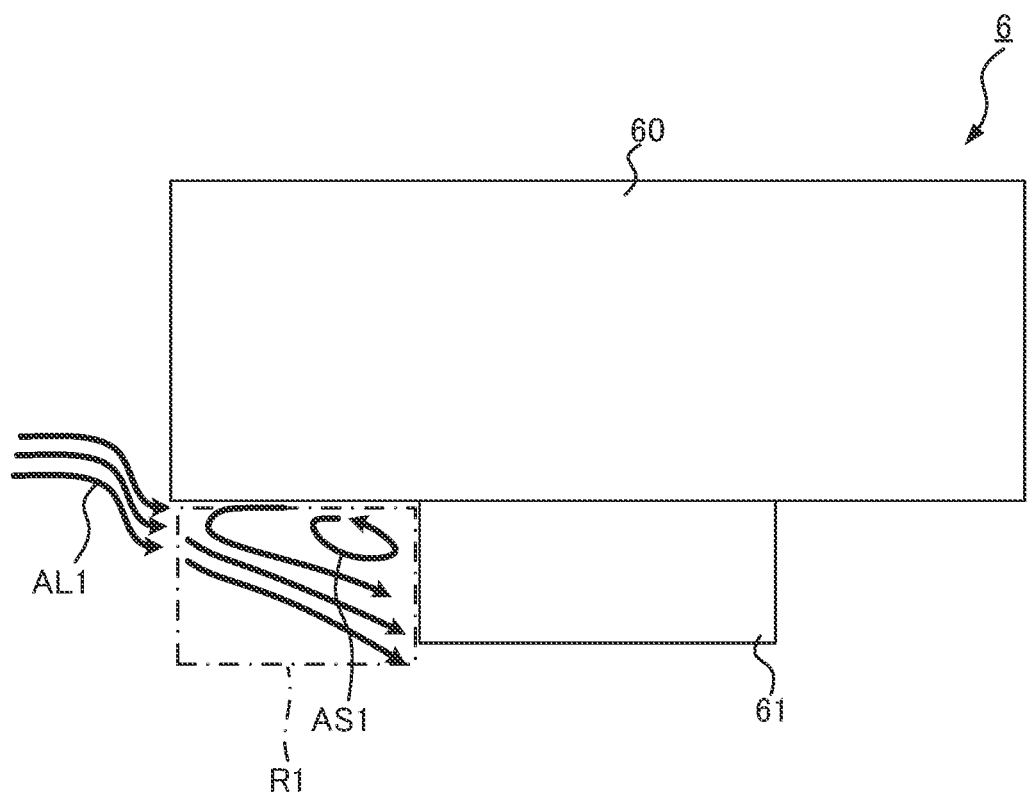
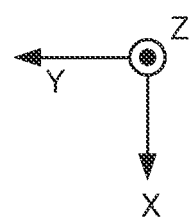

FIG.7
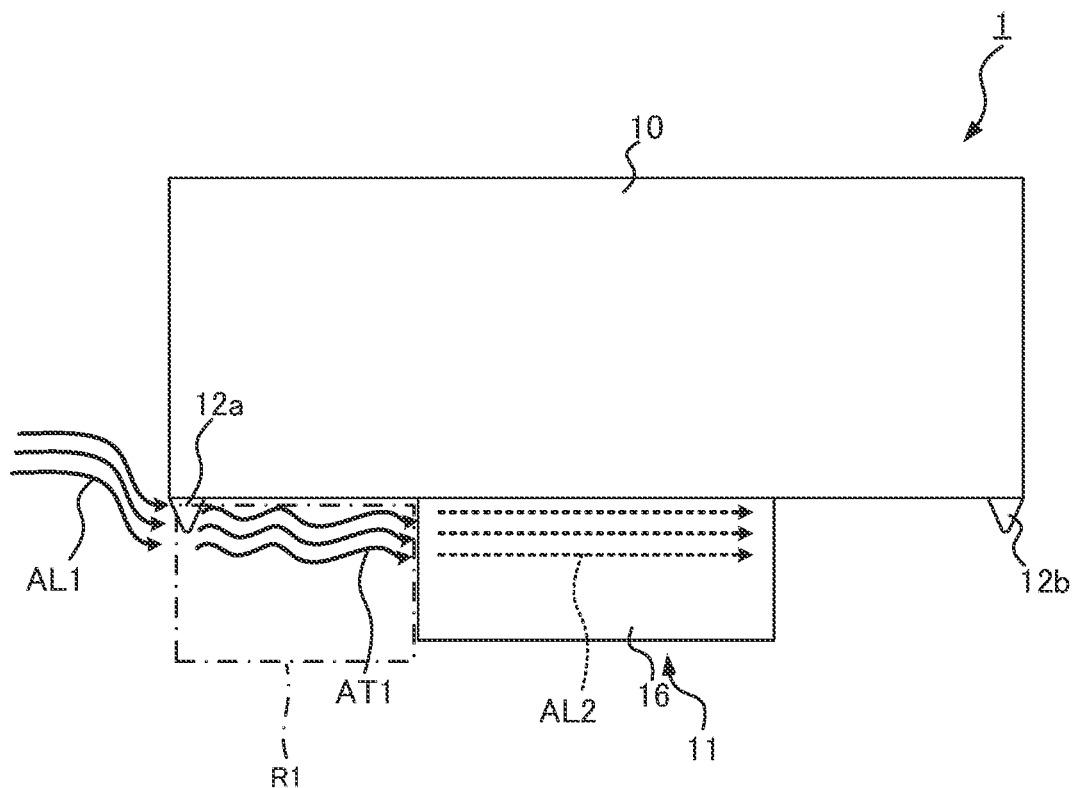
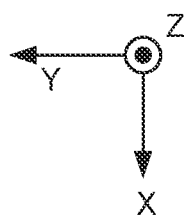

FIG.8
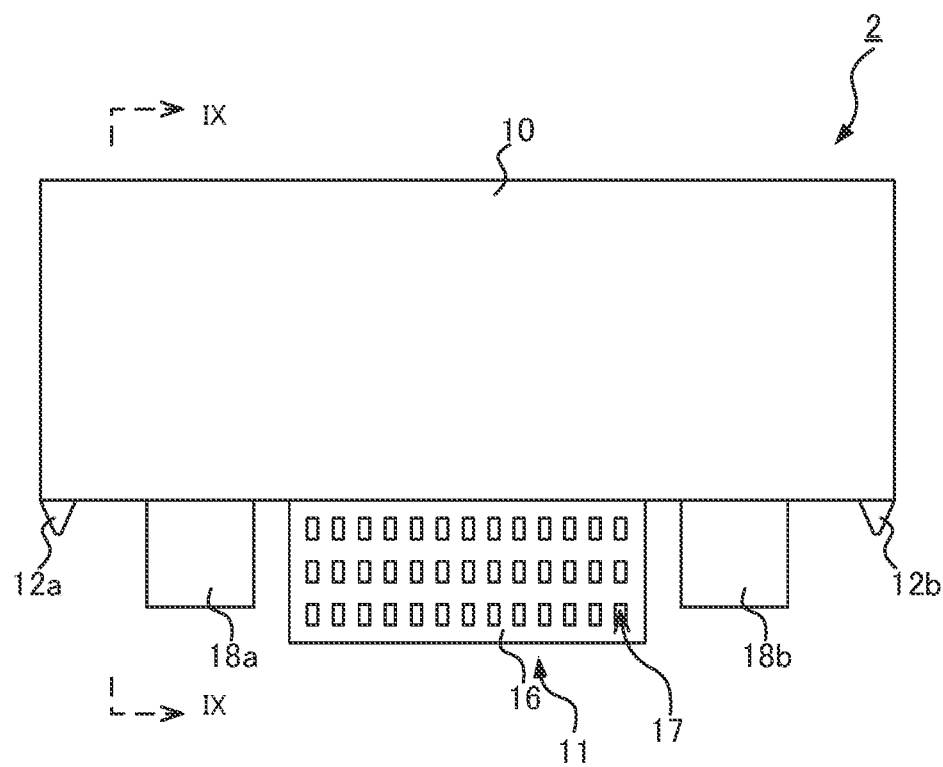
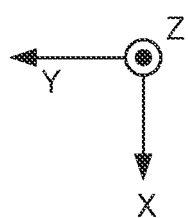

FIG.11
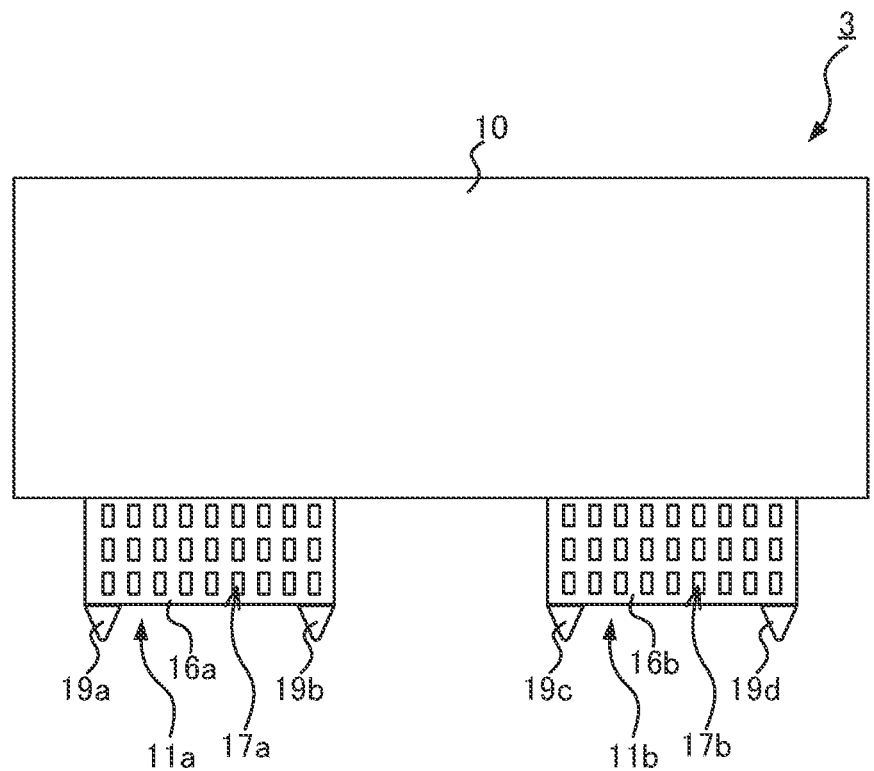
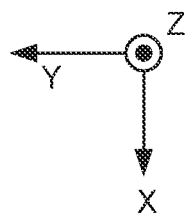

FIG.15
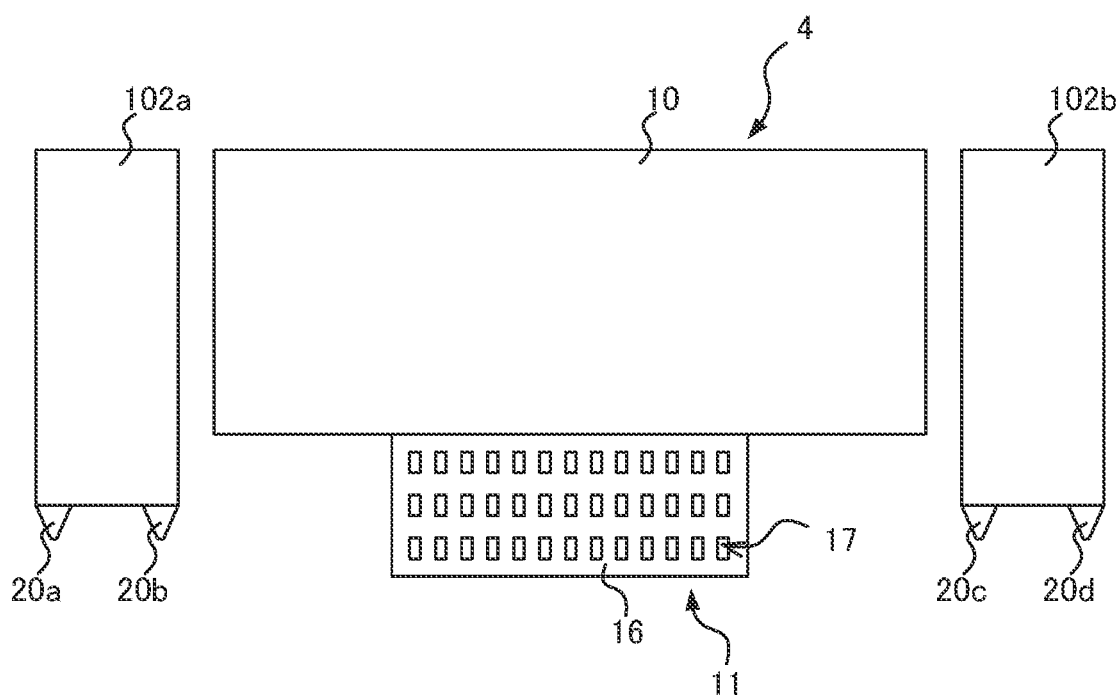
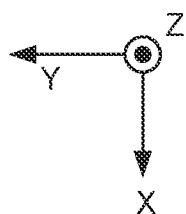

FIG.20
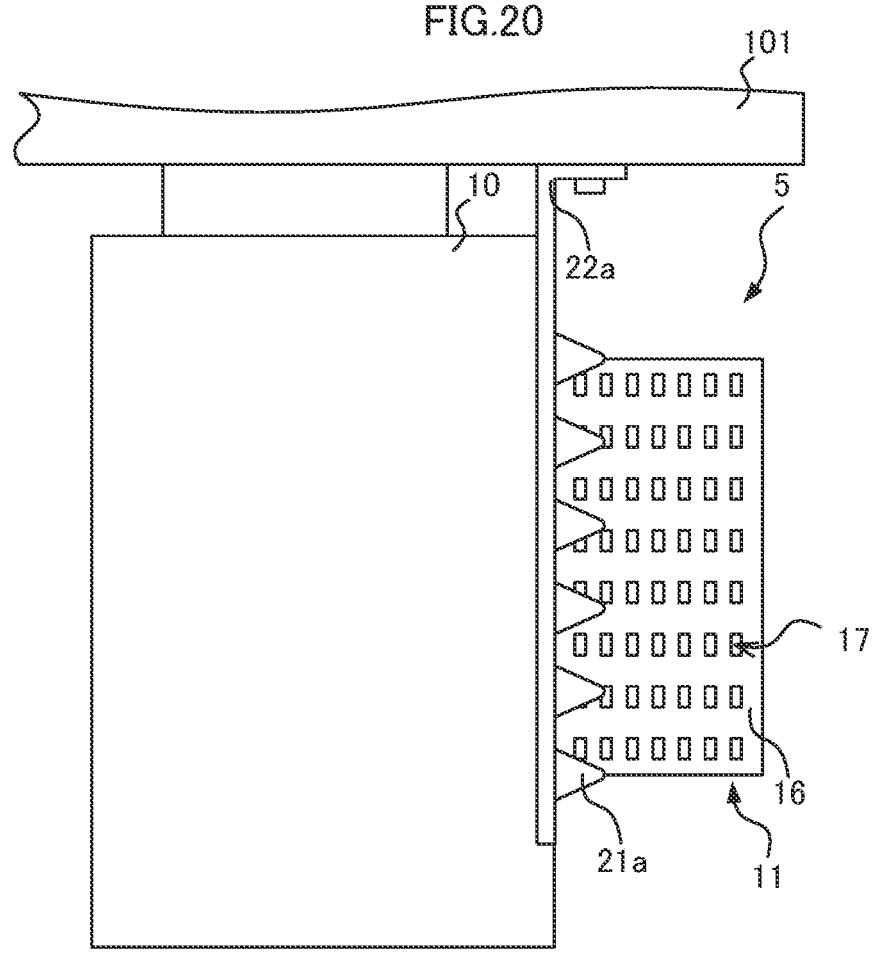
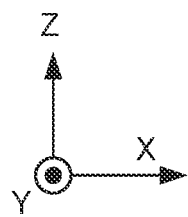

FIG.21
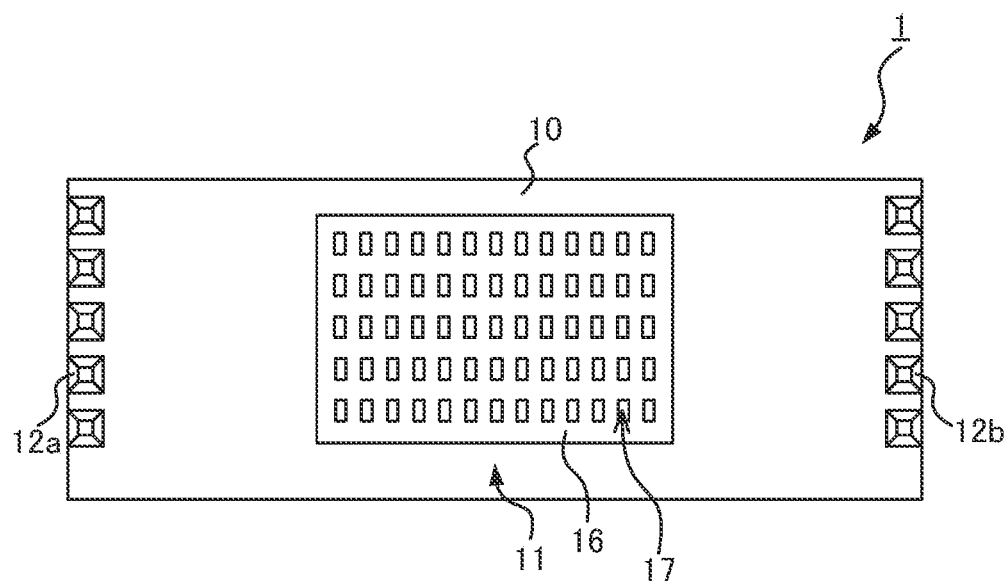
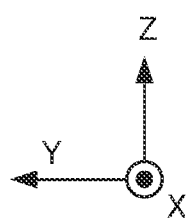

FIG.22
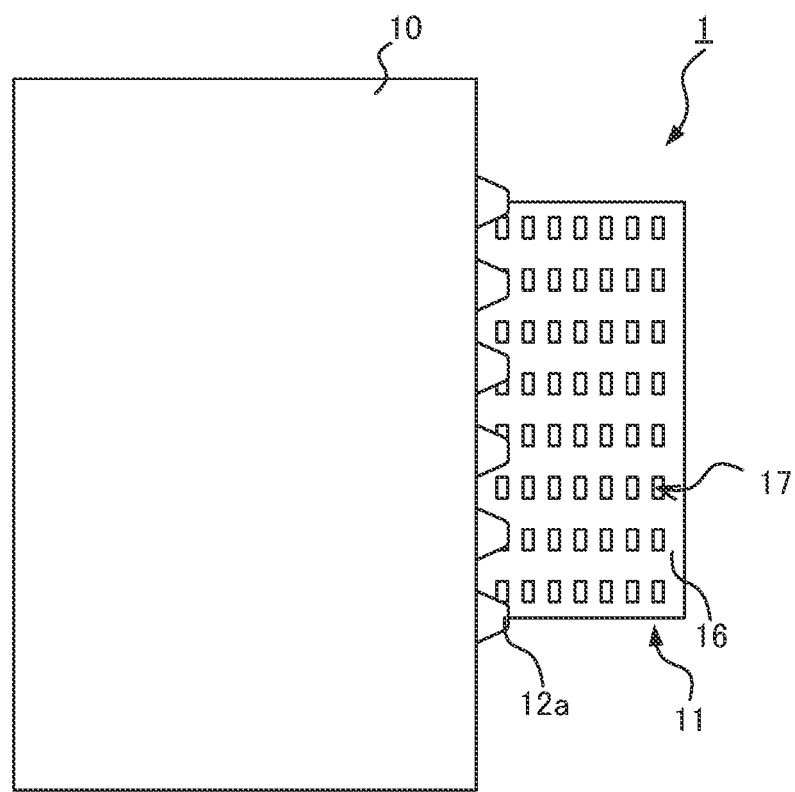
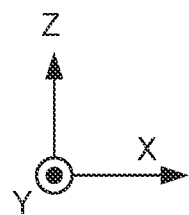

FIG.25
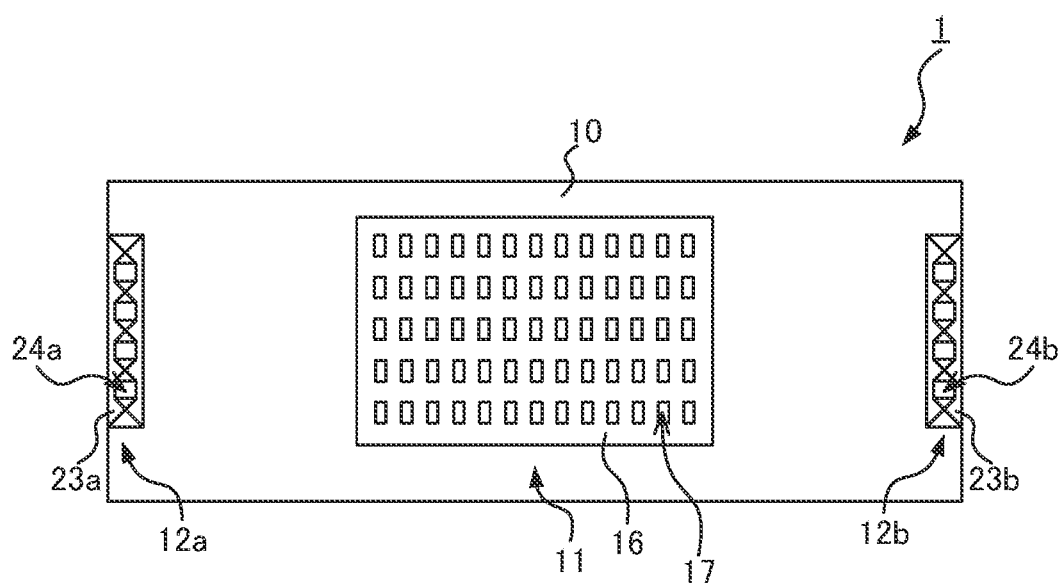
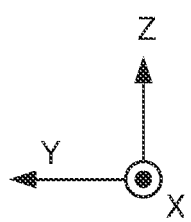

ON-BOARD DEVICE

TECHNICAL FIELD

The present disclosure relates to an in-vehicle device.

BACKGROUND ART

An in-vehicle device mountable on a railway vehicle may include a cooler that is thermally connected to electronic components and cools the electronic components to prevent heat damage on the electronic components during electric conduction. The cooler cools the electronic components by, for example, dissipating heat transferred from the electronic components to air around the cooler.

Patent Literature 1 describes, as an example cooler included in an in-vehicle device, a heat exchanger system including a heat exchanger located on a roof of a vehicle and an air guide plate attached to another device located adjacent to the heat exchanger in the traveling direction of the railway vehicle to guide air to the heat exchanger.

CITATION LIST

Patent Literature

Patent Literature 1: Unexamined Japanese Patent Application Publication No. 2018-43611

SUMMARY OF INVENTION

Technical Problem

The air guide plate described in Patent Literature 1 is inclined with respect to a horizontal plane and extends from the other device to the heat exchanger. The air guide plate is thus elongated in the traveling direction of the railway vehicle, causing the heat exchanger system to be larger in the traveling direction of the railway vehicle. This issue may occur in any in-vehicle device including a cooler as well as in an in-vehicle device on a roof.

In response to the above circumstances, an objective of the present disclosure is to provide an in-vehicle device with improved cooling performance that is less likely to be larger.

Solution to Problem

To achieve the above objective, an in-vehicle device according to an aspect of the present disclosure includes a housing, one or more coolers, and one or more turbulence generating members. The housing is attachable to a railway vehicle and accommodates an electronic component that generates heat. The one or more coolers are attached to and located outside the housing, with the one or more coolers thermally connected to the electronic component. The one or more coolers dissipate heat transferred from the electronic component to passing air occurring when the railway vehicle travels. The one or more turbulence generating members are located on a flow path of the passing air. The one or more turbulence generating members cause turbulence by partly interrupting a flow of the passing air flowing to at least one of the one or more coolers.

Advantageous Effects of Invention

The in-vehicle device according to the above aspect of the present disclosure includes one or more turbulence generating members located on the flow path of passing air to cause turbulence by partly interrupting the flow of the passing air flowing to at least one of the one or more coolers. Turbulence suppresses separation vortices around the housing and allows more air to flow into the cooler, improving the cooling performance for the electronic component. This structure can eliminate an air guide plate extending toward the cooler and thus improve the cooling performance of the in-vehicle device while suppressing an increase in size.

BRIEF DESCRIPTION OF DRAWINGS

FIG. 2 is a top view of the in-vehicle device according to Embodiment 1;

FIG. 4 is a cross-sectional view of the in-vehicle device according to Embodiment 1 taken along line IV-IV in FIG. 3 as viewed in the direction indicated by the arrows;

FIG. 6 is a diagram illustrating an airflow around an in-vehicle device in a comparative example;

FIG. 7 is a diagram illustrating an airflow around the in-vehicle device according to Embodiment 1;

FIG. 8 is a top view of an in-vehicle device according to Embodiment 2;

FIG. 11 is a top view of an in-vehicle device according to Embodiment 3;

FIG. 15 is a top view of the in-vehicle device according to Embodiment 4;

FIG. 20 is a front view of the in-vehicle device according to the second modification of one or more embodiments;

FIG. 21 is a side view of an in-vehicle device according to a third modification of one or more embodiments;

FIG. 22 is a front view of the in-vehicle device according to the third modification of one or more embodiments;

FIG. 25 is a side view of an in-vehicle device according to a fifth modification of one or more embodiments.

DESCRIPTION OF EMBODIMENTS

An in-vehicle device according to embodiments of the present disclosure is described in detail with reference to the drawings. In the figures, the same reference signs denote the same or equivalent components.

Embodiment 1

Figure 1:
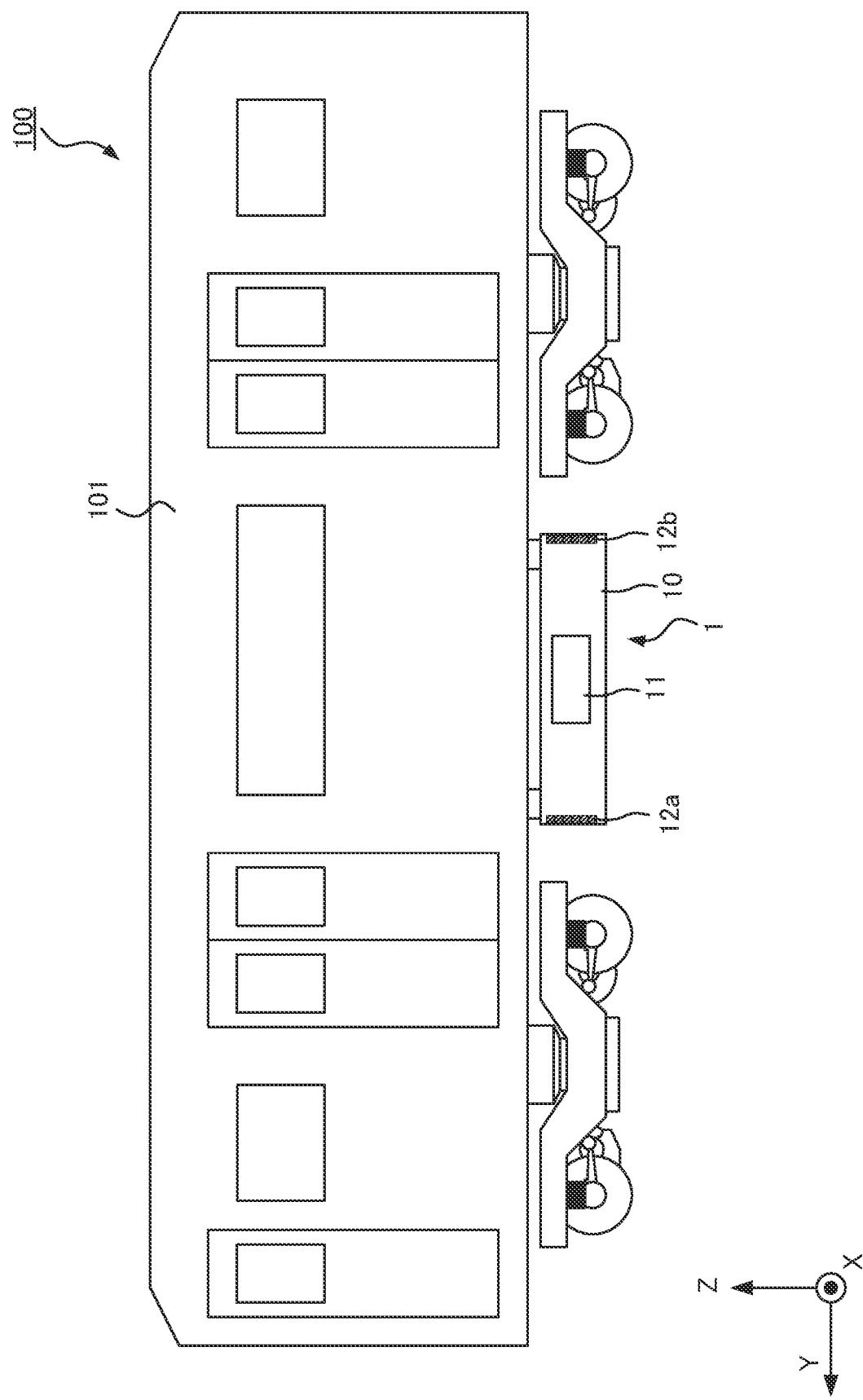
FIG. 1 is a side view of a railway vehicle incorporating an in-vehicle device according to Embodiment 1.

An in-vehicle device 1 is described using an example in-vehicle device mountable on a railway vehicle. As illustrated in FIG. 1, the in-vehicle device 1 is attached under the floor of a vehicle body 101 included in a railway vehicle 100. In FIG. 1, X-axis indicates the width direction of the railway vehicle 100. Y-axis indicates the traveling direction of the railway vehicle 100. Z-axis is orthogonal to X-axis and Y-axis. For the railway vehicle 100 located horizontally, X-axis and Y-axis extend horizontally, and Z-axis extends vertically.

The railway vehicle 100 travels in the positive Y-direction or in the negative Y-direction. When the railway vehicle 100 travels in the positive Y-direction, air flows in the negative Y-direction. When the railway vehicle 100 travels in the negative Y-direction, air flows in the positive Y-direction. As described above, when the railway vehicle 100 travels, passing air occurs as an airflow in a direction opposite to the traveling direction of the railway vehicle 100.

The in-vehicle device 1 is, for example, a power converter that converts power supplied from a current collector that acquires power supplied from a substation through a power supply line to three-phase alternating current (AC) power to be supplied to electric motors for generating a driving force for the railway vehicle 100, and supplies the three-phase AC power to the electric motor. The in-vehicle device 1 includes a housing 10 attachable under the floor of the vehicle body 101, a cooler 11 attached to the housing 10, and turbulence generating members 12a and turbulence generating members 12b located on the flow path of passing air occurring when the railway vehicle 100 travels.

Figure 3:
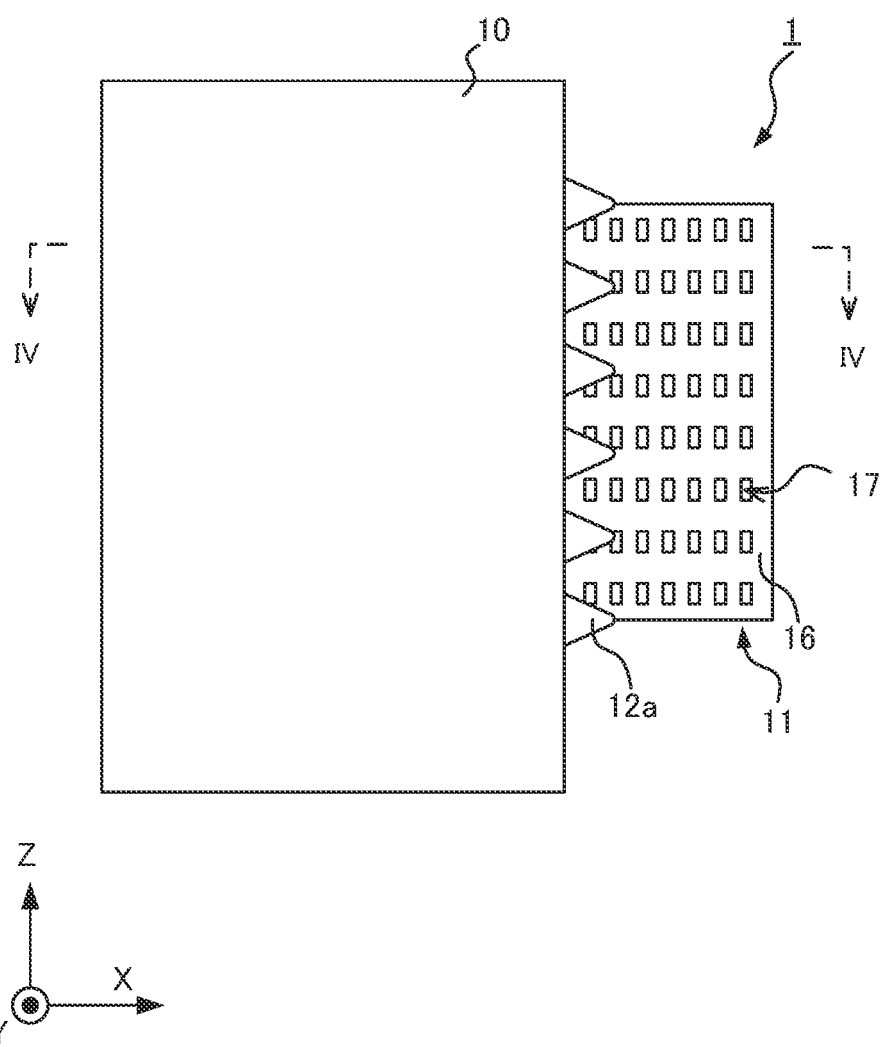
FIG. 3 is a front view of the in-vehicle device according to Embodiment 1.
Figure 5:
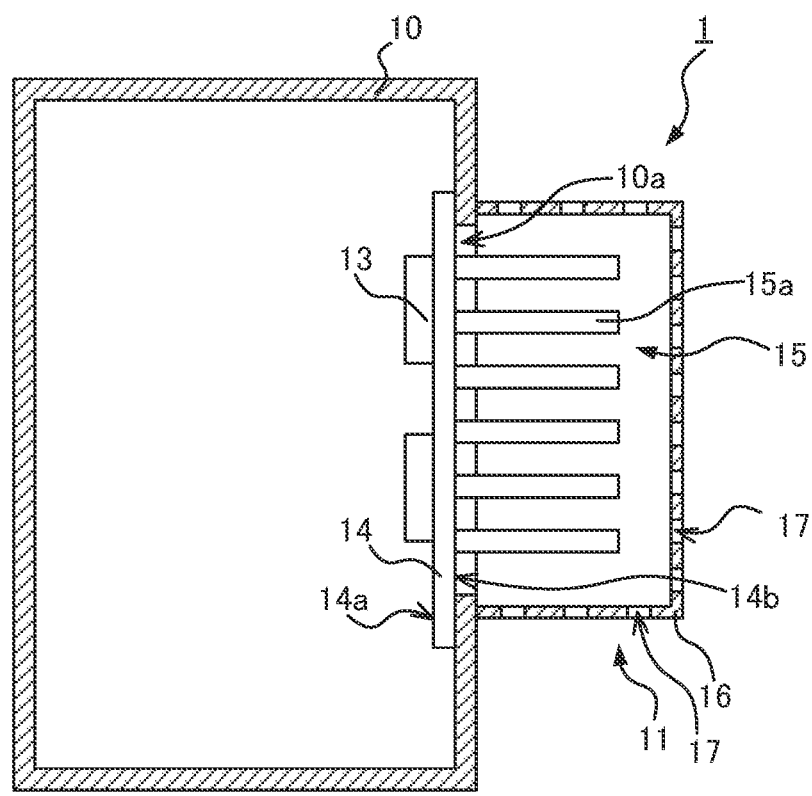
FIG. 5 is a cross-sectional view of the in-vehicle device according to Embodiment 1 taken along line V-V in FIG. 4 as viewed in the direction indicated by the arrows.

The housing 10 is attached under the floor of the vehicle body 101 with unillustrated attaching members. As illustrated in FIG. 2 and in FIG. 3 illustrating the in-vehicle device 1 as viewed in the negative Y-direction, the cooler 11 is attached to an outer surface of the housing 10 facing in the positive X-direction. As illustrated in FIG. 4 being a cross-sectional view taken along line IV-IV in FIG. 3 as viewed in the direction indicated by the arrows and in FIG. 5 being a cross-sectional view taken along line V-V in FIG. 4 as viewed in a direction indicated by the arrows, the housing 10 has an opening 10a in the surface facing in the positive X-direction. The opening 10a is covered with the cooler 11.

The cooler 11 includes a heat-receiving block 14 to which electronic components 13 to undergo heat dissipation are attached, a heat dissipater 15 for dissipating heat transferred from the electronic components 13 through the heat-receiving block 14 to passing air flowing nearby, and a cover 16 covering the heat dissipater 15.

The electronic components 13 are accommodated in the housing 10 and attached to a first main surface 14a of the heat-receiving block 14. The electronic components 13 are elements that generate heat when energized, such as insulated-gate bipolar transistors (IGBTs).

The heat-receiving block 14 has the first main surface 14a to which the electronic components 13 are attached and a second main surface 14b, opposite to the first main surface 14a, to which the heat dissipater 15 is attached. The heat-receiving block 14 receiving the electronic components 13 and the heat dissipater 15 is attached to the housing 10 to cover, with the second main surface 14b, the opening 10a of the housing 10 from inside the housing 10. The heat-receiving block 14 may be attached to the housing 10 firmly enough to maintain a constant positional relationship relative to the housing 10 under vibrations from the railway vehicle 100 that is traveling. More specifically, the heat-receiving block 14 is attached to an inner surface of the housing 10 with an attaching method such as fitting, brazing, welding, attaching with an adhesive, or fastening with a fastener.

The heat-receiving block 14 includes, for example, a flat plate that is large enough to cover the opening 10a. The heat-receiving block 14 is preferably formed from a highly thermally conductive material, or for example, a metal such as copper or aluminum.

The heat dissipater 15 dissipates heat transferred from the electronic components 13 through the heat-receiving block 14 to passing air. This cools the electronic components 13. In Embodiment 1, the heat dissipater 15 includes multiple fins 15a. Each fin 15a is formed from a highly thermally conductive material, or for example, a metal such as copper or aluminum.

The multiple fins 15a are attached to the second main surface 14b of the heat-receiving block 14 and spaced from one another in Z-direction with the main surfaces parallel to an XY plane. Each fin 15a may be attached to the heat-receiving block 14 firmly enough to maintain a constant positional relationship relative to the heat-receiving block 14 under vibrations from the railway vehicle 100 that is traveling. More specifically, each fin 15a is attached to the second main surface 14b of the heat-receiving block 14 with an attaching method such as fitting, brazing, welding, attaching with an adhesive, or fastening with a fastener.

The cover 16 is attached to the housing 10 to cover the heat dissipater 15. The cover 16 has vents 17 through which passing air flows into the cover 16 or passing air flown into the cover 16 flows outside. More specifically, the cover 16 has the vents 17 in each surface. The cover 16 may be attached to the housing 10 firmly enough to maintain a constant positional relationship relative to the housing 10 under vibrations from the railway vehicle 100 that is traveling. More specifically, the cover 16 is attached to the housing 10 to cover the heat dissipater 15 with an attaching method such as fitting, brazing, welding, attaching with an adhesive, or fastening with a fastener.

As illustrated in FIG. 2, the turbulence generating members 12a and 12b are located on the flow path of passing air, or more specifically, on the flow path of passing air near the in-vehicle device 1. The turbulence generating members 12a and 12b cause turbulence by partly interrupting the flow of passing air and partly guiding the remaining passing air along the in-vehicle device 1. The flow path of passing air near the in-vehicle device 1 is, for example, a space around the in-vehicle device 1 with a distance less than or equal to 50 mm from the outer surfaces of the in-vehicle device 1. The turbulence generating members 12a and 12b are attached to an outer surface of the housing 10, with the cooler 11 placed therebetween in Y-direction to partly interrupt the flow of passing air flowing to the cooler 11 when the railway vehicle 100 travels in the positive Y-direction or in the negative Y-direction.

In Embodiment 1, the turbulence generating members 12a and 12b are attached at both ends in Y-direction of an outer surface of the housing 10 intersecting with X-axis, or more specifically, the surface facing in the positive X-direction. More specifically, as illustrated in FIGS. 1 and 3, the turbulence generating members 12a are arranged in Z-direction at the end in the positive Y-direction of the surface of the housing 10 facing in the positive X-direction. Similarly, the multiple turbulence generating members 12b are arranged in Z-direction at the end in the negative Y-direction of the surface of the housing 10 facing in the positive X-direction.

The turbulence generating members 12a and 12b are, for example, cones. More specifically, the turbulence generating members 12a and 12b are cones with the vertices chamfered. With the vertices chamfered, the turbulence generating members 12a and 12b are protrusions with rounded tips. In Embodiment 1, the turbulence generating members 12a and 12b are quadrangular pyramids each having a chamfered vertex, a base that is 30 to 50 mm inclusive on each side, and a height of 30 to 50 mm inclusive.

The conical turbulence generating members 12a and 12b are attached to the housing 10 with the bases of the cones in contact with the housing 10. More specifically, the turbulence generating members 12a and 12b may each be attached, by welding or fastening with fasters, to the housing 10 firmly enough to maintain a constant positional relationship relative to the housing 10 under vibrations from the railway vehicle 100 that is traveling.

The turbulence generating members 12a and 12b is preferably formed from a material that resists damage when coming in contact with foreign objects such as sand and stones contained in passing air. For example, the turbulence generating members 12a and 12b are formed from aluminum.

With the turbulence generating members 12a and 12b with the above shape located on the flow path of passing air, the flow of the passing air is partly interrupted, causing turbulence. In other words, a part of passing air hitting at least one of the turbulence generating members 12a and 12b results in interruption of the flow of the part of passing air while another part of the passing air is allowed to pass between the turbulence generating members 12a or 12b and flow along the housing 10. This causes the passing air to be turbulence.

The flow of passing air around the in-vehicle device 1 with the above structure is described below using the railway vehicle 100 traveling in the positive Y-direction in an example. FIG. 6 illustrates the flow of passing air around an in-vehicle device 6 without turbulence generating members in a comparative example. In FIG. 6, the solid arrows indicate the flow of passing air around the in-vehicle device 6. The in-vehicle device 6 includes the same components as the in-vehicle device 1 except the turbulence generating members. For ease of illustration, FIG. 6 simply illustrates the outer shapes of a housing 60 and a cooler 61 included in the in-vehicle device 6. Vents in a cover included in the cooler 61 are not illustrated.

The passing air flowing from the front to the rear in the traveling direction of the railway vehicle 100, in other words, the passing air flowing in the negative Y-direction, forms a laminar flow AL1 near the in-vehicle device 6. The laminar flow AL1 flowing around the in-vehicle device 6 forms a laminar boundary layer near the housing 60 included in the in-vehicle device 6. The corners of the housing 60 change the shape of the flow path of the passing air. Thus, in an area R1 indicated by the dot-dash line in FIG. 6, the laminar boundary layer around the housing 60 separates, causing a separation vortex AS1 near the housing 60. The separation vortex AS1 is an airflow partly flowing in a direction opposite to the flowing direction of passing air. The area R1 is located in the positive Y-direction from the cooler 61 and is adjacent to the surface of the housing 60 facing in the positive X-direction. The passing air separates on an end face of the housing 60, and the main flow of the passing air flows away from the housing 60. With the separation vortex AS1 occurring near the surface of the cooler 61 facing frontward in the traveling direction, the passing air may insufficiently flow into the cooler 61.

The flow of passing air around the in-vehicle device 1 is illustrated in FIG. 7. In FIG. 7, the solid arrows indicate the flow of passing air around the in-vehicle device 1, and the dotted arrows indicate the flow of passing air inside the cooler 11. For ease of illustration, FIG. 7 does not illustrate the vents 17 in the cover 16 included in the cooler 11. The passing air flowing in the negative Y-direction forms a laminar flow AL1 near the in-vehicle device 1. The laminar flow AL1 flowing around the in-vehicle device 1 forms a laminar boundary layer near the housing 10 included in the in-vehicle device 1. With the turbulence generating members 12a near a corner of the housing 10, the passing air turns into turbulence AT1 in the area R1.

When the turbulence generating members 12a cause turbulence AT1, in other words, when the passing air turns into the turbulence AT1, a turbulent boundary layer forms near the housing 10. As the passing air flows near the housing 10 and downstream, the velocity gradient on the surface of the housing 10 decreases. The boundary layer then separates at a point on which the velocity gradient decreases to 0, in other words, at a separation point. The turbulent boundary layer has a steeper velocity gradient on the surface of the housing 10 than the laminar boundary layer. Thus, the distance between the position at which the turbulent boundary layer forms and the separation point is longer than the distance between the position at which the laminar boundary layer forms and the separation point. In other words, the turbulent boundary layer is less likely to separate than the laminar boundary layer. The turbulence AT1 thus reduces separation vortices.

The passing air as the turbulence AT1 flows along the housing 10 in the negative Y-direction while repeatedly flowing away from and closer to the housing 10, and flows into the cover 16 through the vents 17 in the cover 16 included in the cooler 11. The passing air flown into the cover 16 passes between the multiple fins 15a illustrated in FIG. 5 included in the heat dissipater 15 and is regulated to be a laminar flow AL2 as illustrated in FIG. 7. The in-vehicle device 1 allows more passing air to flow into the cooler 11 than the in-vehicle device 6, improving the cooling performance.

Similarly, when the railway vehicle 100 travels in the negative Y-direction, passing air turned into turbulence with the turbulence generating members 12b flows along the housing 10 in the positive Y-direction while repeatedly flowing away from and closer to the housing 10, and flows into the cover 16 through the vents 17 in the cover 16 included in the cooler 11.

The turbulence generating members 12a and 12b are preferably provided at positions corresponding to the separation points at which separation vortices occur in a case where the turbulence generating members 12a and 12b are not included as illustrated in FIG. 6. More specifically, the turbulence generating members 12a are preferably provided at positions at which separation vortices occur when the railway vehicle 100 travels in the positive Y-direction, and the turbulence generating members 12b are preferably provided at positions at which separation vortices occur when the railway vehicle 100 travels in the negative Y-direction. Examples of positions used as positions at which separation vortices occur include positions at which the shape of the flow path of passing air changes, such as positions near a corner of the housing 10 as illustrated in FIG. 7, or more specifically, at both ends in Y-direction of the surface of the housing 10 facing in the positive X-direction, and positions at which separation vortices determined to occur with simulation.

As described above, in the in-vehicle device 1 according to Embodiment 1, turbulence occurs with the turbulence generating members 12a and 12b located on the flow path of passing air, suppressing separation vortices and allowing passing air to flow along the housing 10. This allows more air to flow into the cooler 11 and improves the cooling performance of the in-vehicle device 1. To improve the cooling performance, the in-vehicle device 1 includes the turbulence generating members 12a and 12b. Such an in-vehicle device 1 including no air guide plate extending toward the cooler 11 is less likely to be larger.

Embodiment 2

The structure of the in-vehicle device is not limited to the above example and may be any structure that suppresses separation vortices and allows more passing air to flow into the cooler 11. An in-vehicle device 2 according to Embodiment 2 in which turbulence caused by the turbulence generating members 12a or the turbulence generating members 12b is regulated before flowing into the cooler 11 is described.

As illustrated in FIG. 8, the in-vehicle device 2 includes, in addition to the components of the in-vehicle device 1 according to Embodiment 1, airflow regulating members 18a between the turbulence generating members 12a and the cooler 11 on the flow path of passing air to regulate passing air, and airflow regulating members 18b between the turbulence generating members 12b and the cooler 11 on the flow path of passing air to regulate passing air.

Figure 9:
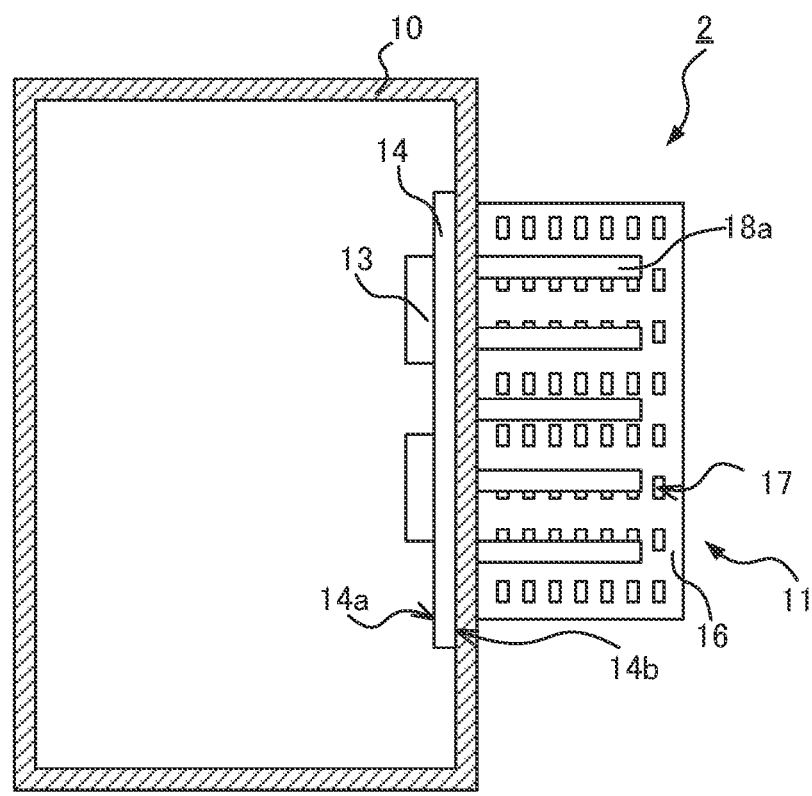
FIG. 9 is a cross-sectional view of the in-vehicle device according to Embodiment 2 taken along line IX-IX in FIG. 8 as viewed in the direction indicated by the arrows.

The airflow regulating members 18a and the airflow regulating members 18b include the same components. The airflow regulating members 18a are illustrated in FIG. 9 being a cross-sectional view taken along line IX-IX in FIG. 8 as viewed in the direction indicated by the arrows. The in-vehicle device 2 includes the airflow regulating members 18a spaced from one another in Z-direction and attached to the housing 10. Each airflow regulating member 18a is a plate with the main surface parallel to an XY plane. Similarly, the in-vehicle device 2 includes multiple airflow regulating members 18b spaced from one another in Z-direction and attached to the housing 10.

The airflow regulating members 18a and 18b may each be attached to the housing 10 firmly enough to maintain a constant positional relationship relative to the housing 10 under vibrations from the railway vehicle 100 that is traveling. More specifically, the airflow regulating members 18a and 18b are attached to the housing 10 with an attaching method such as fitting, brazing, welding, attaching with an adhesive, or fastening with a fastener.

When the railway vehicle 100 travels in the positive Y-direction, the airflow regulating members 18a regulate turbulence caused by the turbulence generating members 12a and guide the turbulence to the cooler 11. When the railway vehicle moves in the negative Y-direction, the airflow regulating members 18b regulate turbulence caused by the turbulence generating members 12b and guide the turbulence to the cooler 11. When the turbulence is regulated and then guided to the cooler 11, passing air flows smoothly into the cooler 11, improving the cooling performance of the in-vehicle device 2.

Figure 10:
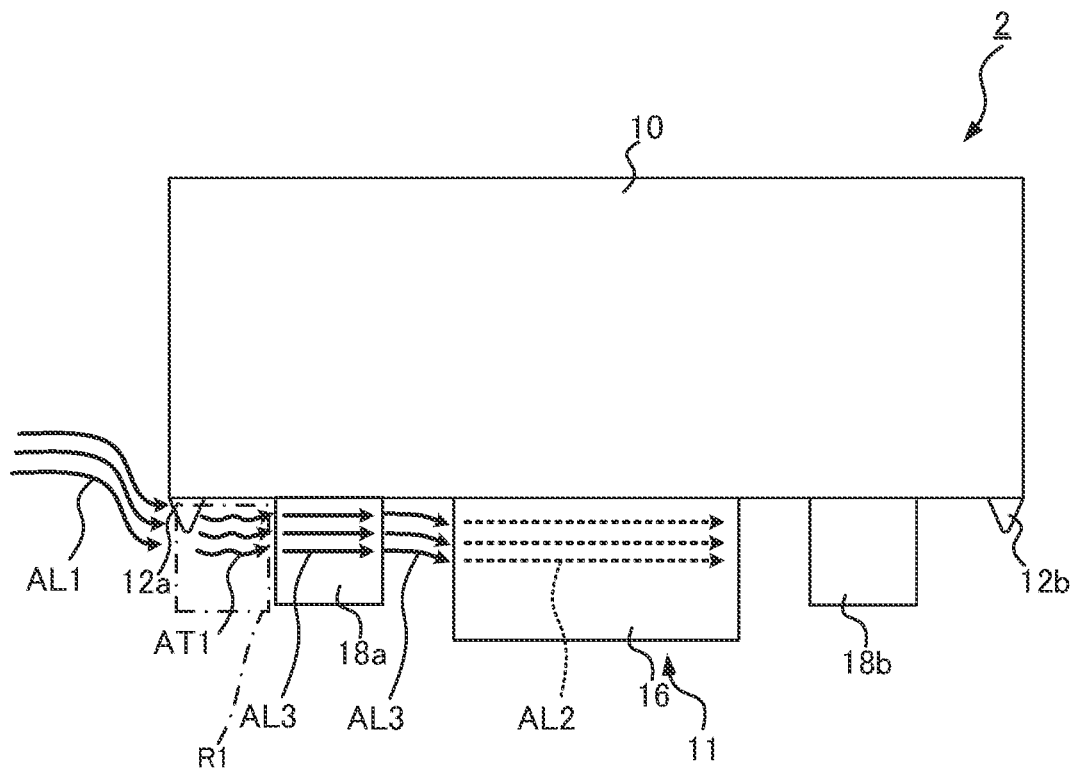
FIG. 10 is a diagram illustrating an airflow around the in-vehicle device according to Embodiment 2.

The flow of passing air around the in-vehicle device 2 with the above structure is described with reference to FIG. 10 using the railway vehicle 100 traveling in the positive Y-direction in an example. FIG. 10 is viewed in the same manner as FIG. 7. As in Embodiment 1, the passing air flowing in the negative Y-direction forms a laminar flow AL1 near the in-vehicle device 2 and turns into turbulence AT1 in the area R1. The turbulence AT1 is regulated by the airflow regulating members 18a to be a laminar flow AL3. The passing air being the laminar flow AL3 after passing through the airflow regulating members 18a flows into the cover 16 through the vents 17 in the cover 16 included in the cooler 11. The passing air flown into the cover 16 flows between the multiple fins 15a included in the heat dissipater 15 and is regulated again to be a laminar flow AL2.

Similarly, when the railway vehicle 100 travels in the negative Y-direction, passing air turned into turbulence with the turbulence generating members 12b turns into a laminar flow with the airflow regulating members 18b and flows into the cover 16 through the vents 17 in the cover 16 included in the cooler 11.

When the distance between each of the airflow regulating members 18a and 18b and the cooler 11 is longer, a laminar boundary layer may separate between each of the airflow regulating members 18a and 18b and the cooler 11, causing a separation vortex. To suppress separation vortices, the distance between each of the airflow regulating members 18a and 18b and the cooler 11 is preferably shorter than a distance that may cause a separation vortex. The distance at which a separation vortex may occur can be determined, for example, with simulation.

As described above, in the in-vehicle device 2 according to Embodiment 2, the passing air turned into turbulence with the turbulence generating members 12a or the turbulence generating members 12b is regulated by the airflow regulating members 18a or the airflow regulating members 18b. The passing air regulated by the airflow regulating members 18a or the airflow regulating members 18b is guided to the cooler 11. Passing air thus flows more smoothly into the cooler 11. The in-vehicle device 2 may have higher cooling performance than the in-vehicle device 1.

Embodiment 3

The in-vehicle device 1 according to Embodiment 1 and the in-vehicle device 2 according to Embodiment 2 each include one cooler 11. However, the in-vehicle device 1 or 2 may include any number of coolers. An in-vehicle device 3 according to Embodiment 3 including multiple coolers 11a and 11b is described.

The in-vehicle device 3 illustrated in FIG. 11 includes coolers 11a and 11b spaced from each other in the traveling direction of the railway vehicle 100, in other words, in Y-direction. The coolers 11a and 11b each include the same components as the cooler 11 in the in-vehicle device 1 according to Embodiment 1. The cooler 11a includes a cover 16a with vents 17a through which passing air flows into the cover 16a or passing air flown into the cover 16a flows outside. The cooler 11b includes a cover 16b with vents 17b through which passing air flows into the cover 16b or passing air flown into the cover 16b flows outside.

The in-vehicle device 3 includes turbulence generating members 19a and 19b attached to an outer surface of the cooler 11a and the turbulence generating members 19c and 19d attached to an outer surface of the cooler 11b. The shape and the material of the turbulence generating members 19a to 19d are the same as the shape and the material of the turbulence generating members 12a and 12b included in the in-vehicle device 1 according to Embodiment 1. The turbulence generating members 19a and 19b are attached to the cover 16a included in the cooler 11a. In Embodiment 3, the turbulence generating members 19a and 19b are attached at both ends in Y-direction of a surface of the cover 16a intersecting with X-axis, or more specifically, the surface facing in the positive X-direction. The turbulence generating members 19c and 19d are attached to the cover 16b included in the cooler 11b. In Embodiment 3, the turbulence generating members 19c and 19d are attached at both ends in Y-direction of a surface of the cover 16b intersecting with X-axis, or more specifically, the surface facing in the positive X-direction.

With the turbulence generating members 19a to 19d on the flow path of passing air, the flow of the passing air is partly interrupted, causing turbulence. In other words, a part of passing air hitting at least one of the turbulence generating members 19a to 19d results in interruption of the flow of the part of passing air while another part of the passing air is allowed to pass between the turbulence generating members 19a, between turbulence generating members 19b, between the turbulence generating members 19c, or between the turbulence generating members 19d, and flow along the cover 16a or the cover 16b. This causes the passing air to be turbulence.

Figure 12:
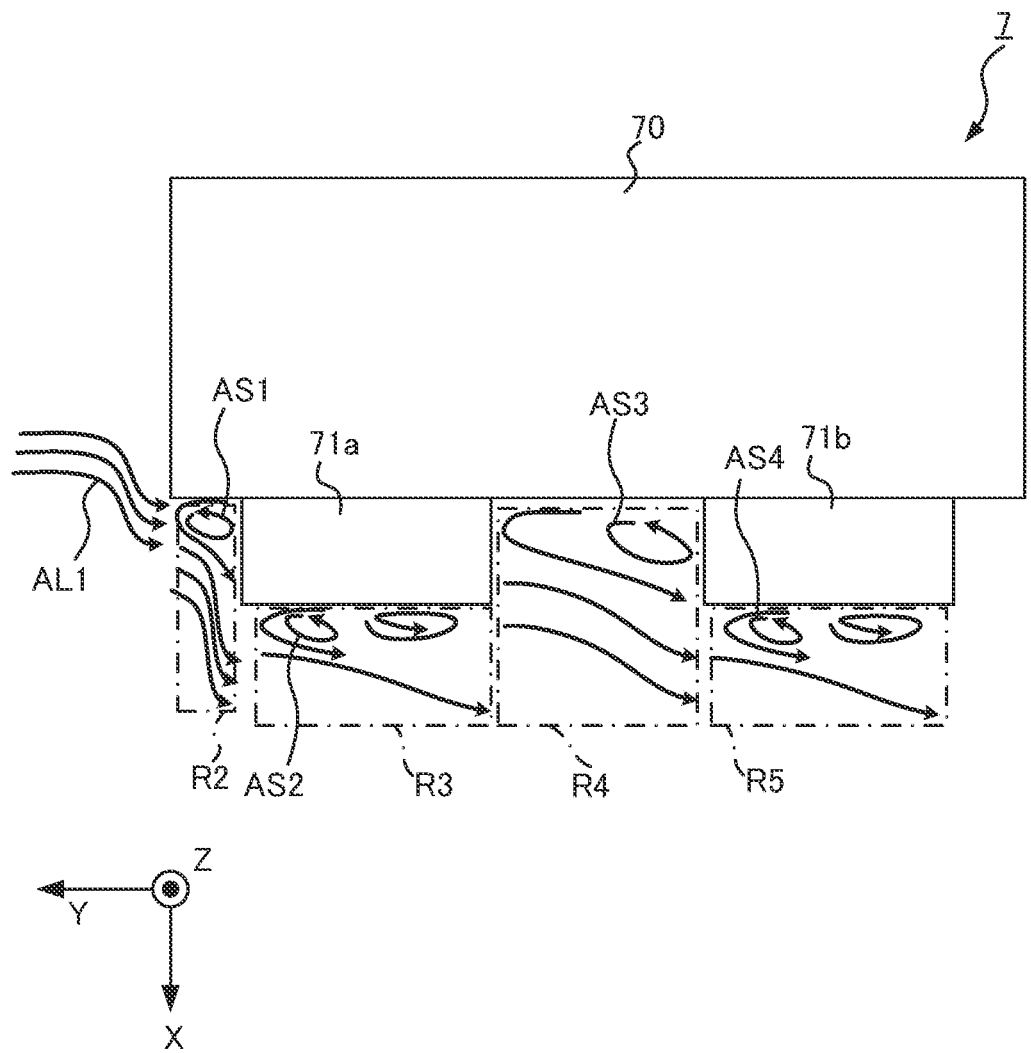
FIG. 12 is a diagram illustrating an airflow around an in-vehicle device in a comparative example.

The flow of passing air around the in-vehicle device 3 with the above structure is described below using the railway vehicle 100 traveling in the positive Y-direction in an example. FIG. 12 illustrates the flow of the passing air around an in-vehicle device 7 without turbulence generating members in a comparative example. FIG. 12 is viewed in the same manner as FIG. 6. The in-vehicle device 7 includes the same components as the in-vehicle device 3 except the turbulence generating members. For ease of illustration, FIG. 12 simply illustrates the outer shapes of a housing 70, a cooler 71a, and a cooler 71b included in the in-vehicle device 7. Vents in covers included in the coolers 71a and 71b are not illustrated.

The passing air flowing in the negative Y-direction forms a laminar flow AL1 near the in-vehicle device 7. The laminar flow AL1 flowing around the in-vehicle device 7 forms a laminar boundary layer near the housing 70 included in the in-vehicle device 7. The corners of the housing 70 change the shape of the flow path of the passing air. Thus, in an area R2 indicated by the dot-dash line in FIG. 12, the laminar boundary layer around the housing 70 separates, causing a separation vortex AS1 near the housing 70. The area R2 is located frontward from the cooler 71a in the traveling direction of the railway vehicle 100, in other words, in the positive Y-direction from the cooler 71a, and is adjacent to the surface of the housing 70 facing in the positive X-direction. The passing air separates on an end face of the housing 70, and the main flow of the passing air flows away from the housing 70. With the separation vortex AS1 occurring near the surface of the cooler 71a facing frontward in the traveling direction, the passing air may insufficiently flow into the cooler 71a.

The cooler 71a protruding from an outer surface of the housing 70 in the positive X-direction changes the shape of the flow path of passing air. Thus, in an area R3 located in the positive X-direction from the cooler 71a, the laminar boundary layer around the cooler 71a separates, causing a separation vortex AS2 near the cooler 71a. The passing air separates on an end face of the cooler 71a, and the main flow of passing air flows away from the cooler 71a. With the separation vortex AS2 occurring in the positive X-direction from the cooler 71a, the passing air may insufficiently flow into the cooler 71a.

With the coolers 71a and 71b spaced from each other in Y-direction, the shape of the flow path of passing air changes in an area R4 located in the negative Y-direction from the cooler 71a and in the positive Y-direction from the cooler 71b. Thus, in the area R4, the laminar boundary layer around the housing 70 separates, causing a separation vortex AS3 near the housing 70. The passing air separates between the coolers 71a and 71b in the positive X-direction from the housing 70, and the main flow of the passing air flows away from the housing 70. With the separation vortex AS3 occurring near the surface of the cooler 71b facing frontward in the traveling direction, the passing air may insufficiently flow into the cooler 71b.

The cooler 71b protruding from an outer surface of the housing 70 in the positive X-direction changes the shape of the flow path of passing air. Thus, an area R5 located in the positive X-direction from the cooler 71b, the laminar boundary layer around the cooler 71b separates, causing a separation vortex AS4 near the cooler 71b. The passing air separates on an end face of the cooler 71b, and the main flow of the passing air flows away from the cooler 71b. With the separation vortex AS4 occurring in the positive X-direction from the cooler 71b, the passing air may insufficiently flow into the cooler 71b.

Figure 13:
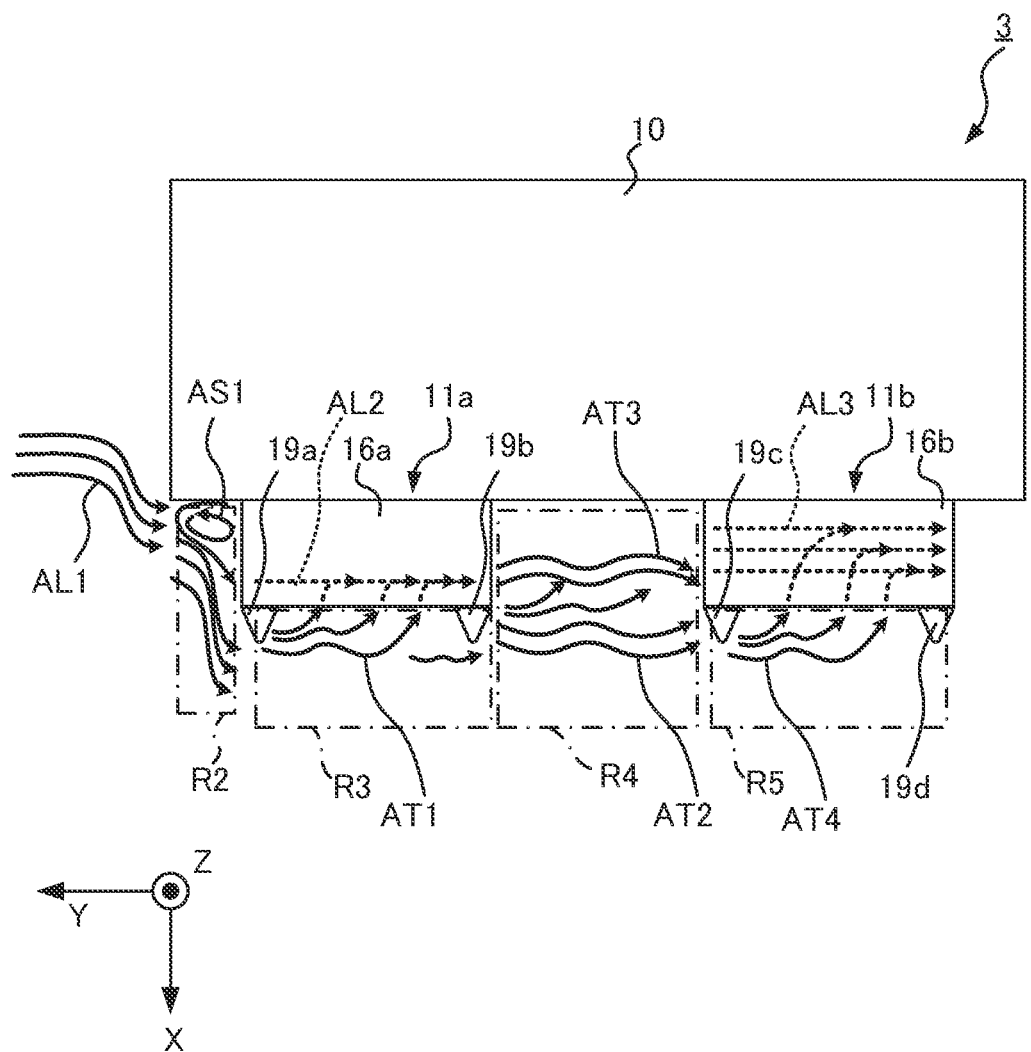
FIG. 13 is a diagram illustrating an airflow around the in-vehicle device according to Embodiment 3.

FIG. 13 illustrates the flow of the passing air around the in-vehicle device 3. The figure is viewed in the same manner as FIG. 7. For ease of illustration, FIG. 13 does not illustrate the vents 17a in the cover 16a included in the cooler 11a and the vents 17b in the cover 16b included in the cooler 11b. The passing air flowing in the negative Y-direction forms a laminar flow AL1 near the in-vehicle device 3. The laminar flow AL1 flowing around the in-vehicle device 3 forms a laminar boundary layer near the housing 10 included in the in-vehicle device 3. As in FIG. 12, in the area R2, the laminar boundary layer around the housing 10 separates, causing a separation vortex AS1 near the housing 10.

As illustrated in FIG. 13, with the turbulence generating members 19a at a corner of the cover 16a in the cooler 11a, the passing air turns into turbulence AT1 in the area R3. The turbulence AT1 flows along the cover 16a in the negative Y-direction while repeatedly flowing away from and closer to the cooler 11a.

By the turbulence generating members 19a causing the turbulence AT1, in other words, by the passing air turning into the turbulence AT1, a turbulent boundary layer forms near the cooler 11a. As described in Embodiment 1, the turbulent boundary layer is less likely to separate than the laminar boundary layer. The turbulence AT1 thus suppresses separation vortices.

The passing air as the turbulence AT1 thus flows in the negative Y-direction while repeatedly flowing away from and closer to the cooler 11a. A part of the passing air as the turbulence AT1 flows into the cover 16a through the vents 17a in the cover 16a included in the cooler 11a. The passing air flown into the cover 16a passes between the multiple fins 15a included in the heat dissipater 15 and is regulated to be a laminar flow AL2.

Another part of the passing air as the turbulence AT1 flows along the cooler 11a in the negative Y-direction and hits the turbulence generating members 19b to be turbulence AT2 in the area R4. A part of the turbulence AT2 flows along the housing 10 in the negative Y-direction while repeatedly flowing away from and closer to the housing 10.

A part of the passing air as the turbulence AT2 flows toward the housing 10 and mixes with the passing air turned into the laminar flow AL2 after passing between the multiple fins 15a in the heat dissipater 15 included in the cooler 11a. The laminar flow AL2 then turns into turbulence AT3, and a turbulent boundary layer forms near the housing 10 between the coolers 11a and 11b. As described in Embodiment 1, the turbulent boundary layer is less likely to separate than the laminar boundary layer. The turbulence AT3 thus reduces separation vortices.

The passing air as the turbulence AT3 thus flows along the housing 10 in the negative Y-direction while flowing away from and closer to the housing 10, and flows into the cover 16b through the vents 17b in the cover 16b included in the cooler 11b. The passing air flown into the cover 16b passes between the multiple fins 15a in the heat dissipater 15 and is regulated to be a laminar flow AL3.

Another part of the passing air as the turbulence AT2 flows in the negative Y-direction. With the turbulence generating members 19c at a corner of the cover 16b in the cooler 11b, the passing air turns into turbulence AT4 in the area R5. When the turbulence generating members 19c cause the turbulence AT4, in other words, when the passing air turns into the turbulence AT4, a turbulent boundary layer forms near the cover 16b. As described in Embodiment 1, the turbulent boundary layer is less likely to separate than the laminar boundary layer. The turbulence AT4 thus reduces separation vortices.

The passing air as the turbulence AT4 thus flows along the cooler 11b in the negative Y-direction while repeatedly flowing away from and closer to the cooler 11b. A part of the passing air as the turbulence AT4 flows into the cover 16b through the vents 17b in the cover 16b included in the cooler 11b. The passing air flown into the cover 16b passes between the multiple fins 15a in the heat dissipater 15 and is regulated to be the laminar flow AL3.

As described above, the in-vehicle device 3 allows more passing air to flow into the coolers 11a and 11b than the in-vehicle device 7, improving the cooling performance.

Similarly, when the railway vehicle 100 travels in the negative Y-direction, passing air turned into turbulence with the turbulence generating members 19d flows into the cover 16b through the vents 17b in the cover 16b included in the cooler 11b. A part of the passing air turned into turbulence with the turbulence generating members 19c mixes with the passing air regulated to be a laminar flow after passing between the multiple fins 15a in the heat dissipater 15 included in the cooler 11b, causing turbulence. The resultant turbulence flows along the housing 10 in the positive Y-direction and into the cover 16a through the vents 17a in the cover 16a included in the cooler 11a. Additionally, the passing air turned into turbulence with the turbulence generating members 19b flows into the cover 16a through the vents 17a in the cover 16a included in the cooler 11a.

The turbulence generating members 19a to 19d are preferably provided at positions corresponding to the separation points at which separation vortices occur in a case where the turbulence generating members 19a to 19d are not included as illustrated in FIG. 12. More specifically, as illustrated in FIG. 13, the turbulence generating members 19a is preferably located at the end in the positive Y-direction of the surface of the cover 16a facing in the positive X-direction. The turbulence generating members 19b is preferably located at the end in the negative Y-direction of the surface of the cover 16a facing in the positive X-direction. The turbulence generating members 19c is preferably located at the end in the positive Y-direction of the surface of the cover 16b facing in the positive X-direction. The turbulence generating members 19d is preferably located at the end in the negative Y-direction of the surface of the cover 16b facing in the positive X-direction.

As described above, in the in-vehicle device 3 according to Embodiment 3, turbulence occurs with the turbulence generating members 19a to 19d located on the flow path of passing air, reducing separation vortices and allowing passing air to flow into the coolers 11a and 11b. More air can thus flow into the coolers 11a and 11b.

Embodiment 4

In Embodiments 1 and 2, the turbulence generating members 12a and 12b are attached to an outer surface of the housing 10 included in the in-vehicle devices 1 and 2. The turbulence generating members 12a and 12b may be at any positions on the flow path of passing air that allow the turbulence generating members 12a and 12b to partly interrupt the flow of passing air flowing to the cooler 11. An in-vehicle device 4 according to Embodiment 4 including turbulence generating members 20a and turbulence generating members 20b is described. The turbulence generating members 20a and 20b are located outside and adjacent to the housing 10, or more specifically, are attached to outer surfaces of a device attached to the railway vehicle 100.

Figure 14:
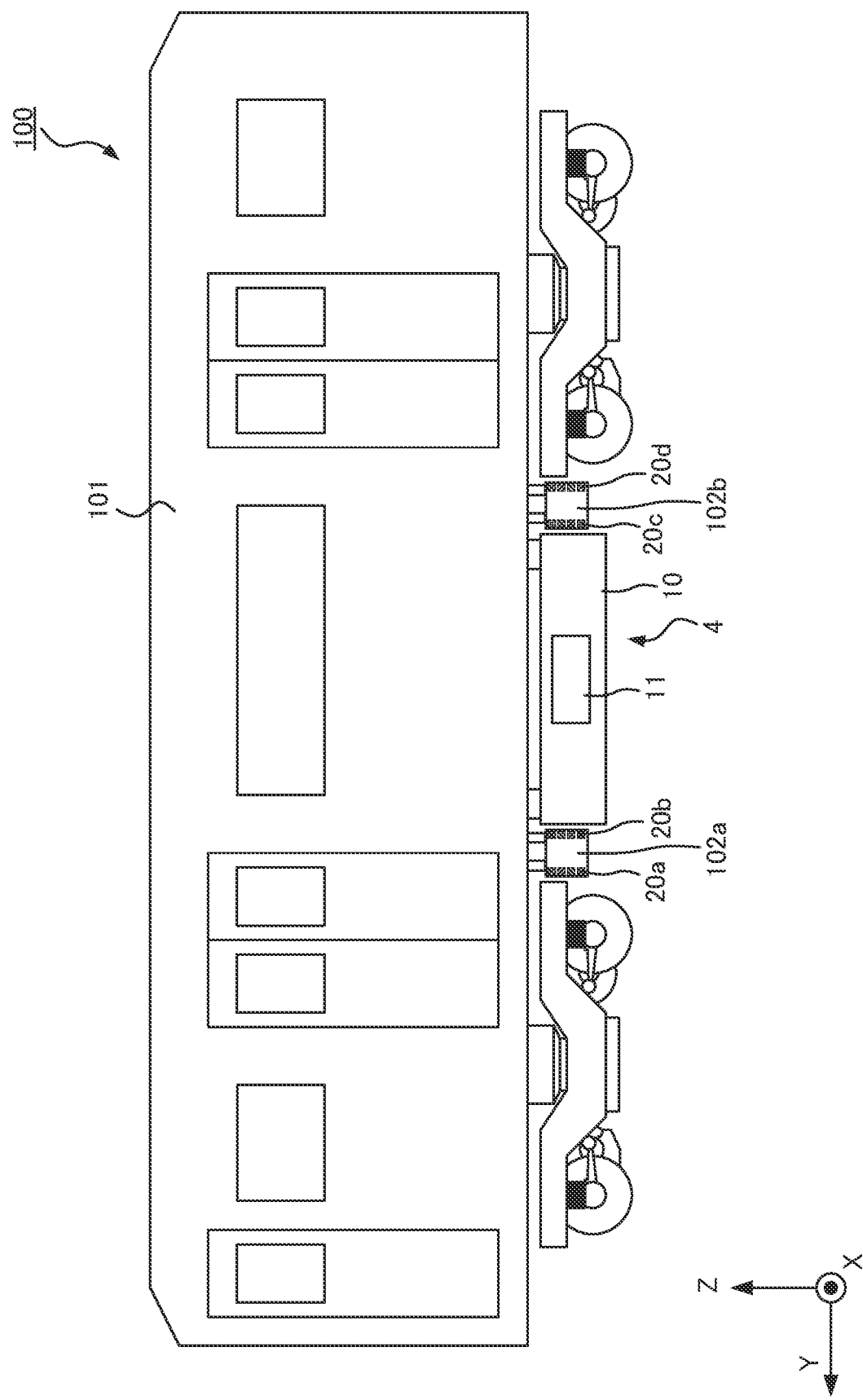
FIG. 14 is a side view of a railway vehicle incorporating an in-vehicle device according to Embodiment 4.

As illustrated in FIG. 14, the railway vehicle 100 receives a device 102a and a device 102b under the floor of the vehicle body 101. As illustrated in FIG. 15, the devices 102a and 102b are longer than the in-vehicle device 4 in X-direction. The in-vehicle device 4 includes the turbulence generating members 20a and 20b attached to the device 102a and turbulence generating members 20c and 20d attached to the device 102b. The shape and the material of the turbulence generating members 20a to 20d are the same as the shape and the material of the turbulence generating members 12a and 12b included in the in-vehicle device 1 according to Embodiment 1.

The turbulence generating members 20a to 20d are located on the flow path of passing air, or more specifically, on the flow path of passing air near the devices 102a and 102b adjacent to the in-vehicle device 4. The turbulence generating members 20a to 20d cause turbulence by partly interrupting the flow of passing air and partly guiding the remaining passing air along the devices 102a and 102b. The flow path of passing air near the devices 102a and 102b is, for example, a space around the devices 102a and 102b with distances from the outer surfaces of the devices 102a and 102b being less than or equal to 50 mm. The turbulence generating members 20a and 20b are attached to both ends in Y-direction of a surface of the device 102a intersecting with X-axis, or more specifically, the surface facing in the positive X-direction. The turbulence generating members 20c and 20d are attached to both ends in Y-direction of a surface of the device 102b intersecting with X-axis, or more specifically, the surface facing in the positive X-direction.

Figure 16:
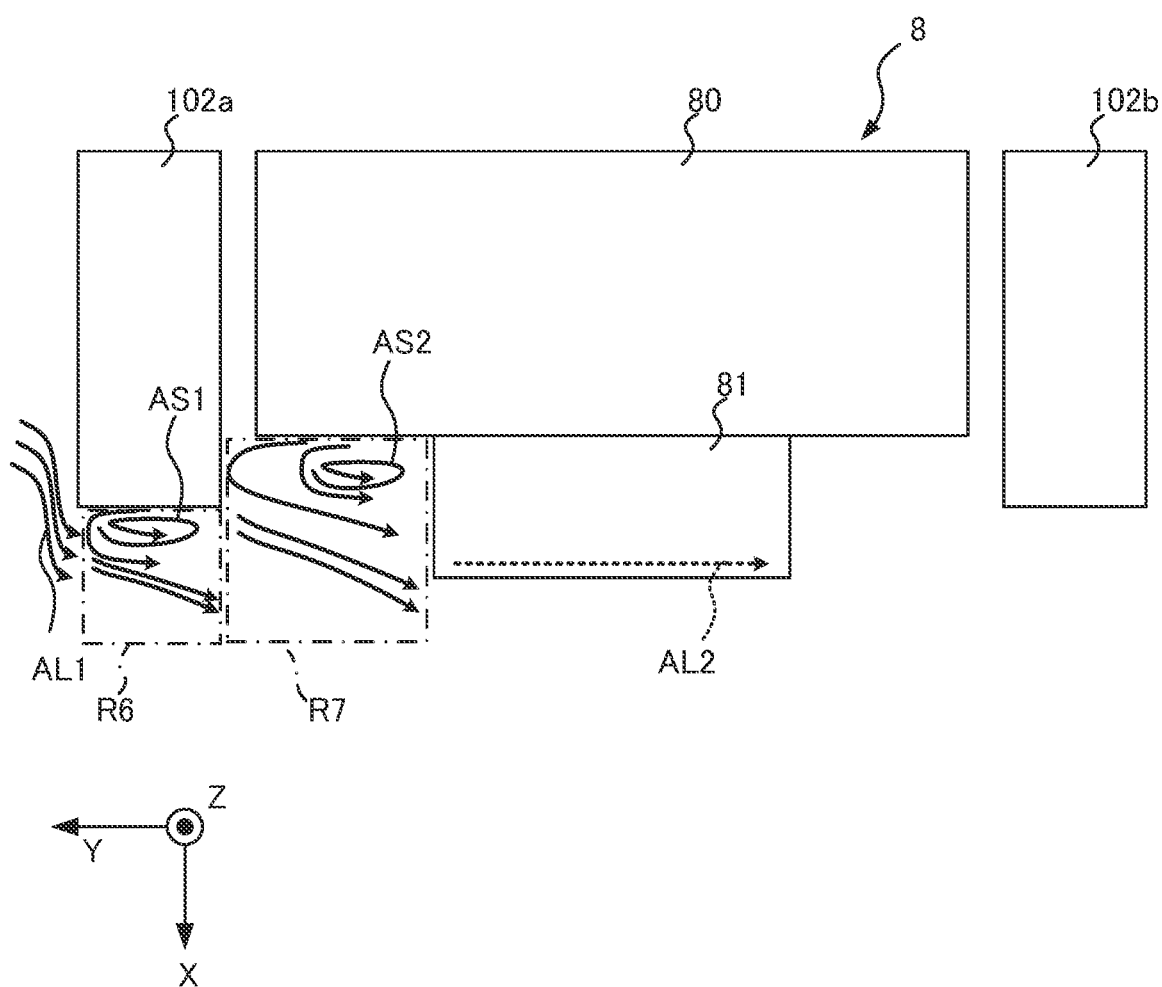
FIG. 16 is a diagram illustrating an airflow around an in-vehicle device in a comparative example.

The flow of passing air around the in-vehicle device 4 with the above structure is described below using the railway vehicle 100 traveling in the positive Y-direction in an example. FIG. 16 illustrates the flow of the passing air around an in-vehicle device 8 without turbulence generating members in a comparative example. FIG. 16 is viewed in the same manner as FIG. 6. The in-vehicle device 8 includes the same components as the in-vehicle device 4 except the turbulence generating members. As illustrated in FIG. 16, the devices 102a and 102b are longer than the in-vehicle device 8 in X-direction. For ease of illustration, FIG. 16 simply illustrates the outer shapes of a housing 80 and a cooler 81 included in the in-vehicle device 8. Vents in a cover included in the cooler 81 are not illustrated.

The passing air flowing in the negative Y-direction forms a laminar flow AL1 near the device 102a. The laminar flow AL1 flowing around the device 102a forms a laminar boundary layer near the device 102a. The corners of the device 102a change the shape of the flow path of the passing air. Thus, in an area R6 indicated by the dot-dash line in FIG. 16, the laminar boundary layer around the device 102a separates, causing a separation vortex AS1 near the device 102a. The area R6 is located in the positive X-direction from the device 102a. The passing air separates on the end face of the device 102a, and the main flow of the passing air flows away from the device 102a.

As described above, the device 102a is longer than the in-vehicle device 8 in X-direction. This structure changes the shape of the flow path of the passing air in an area R7 located in the positive X-direction from the housing 80 in the in-vehicle device 8 and in the positive Y-direction from the cooler 81. Thus, in the area R7, the laminar boundary layer around the housing 80 separates, causing a separation vortex AS2 near the housing 80. The passing air separates on an end face of the housing 80, and the main flow of the passing air flows away from the housing 80. As described above, with the separation vortices AS1 and AS2 occurring near the surface of the cooler 81 facing frontward in the traveling direction, the passing air may insufficiently flow into the cooler 81.

Figure 17:
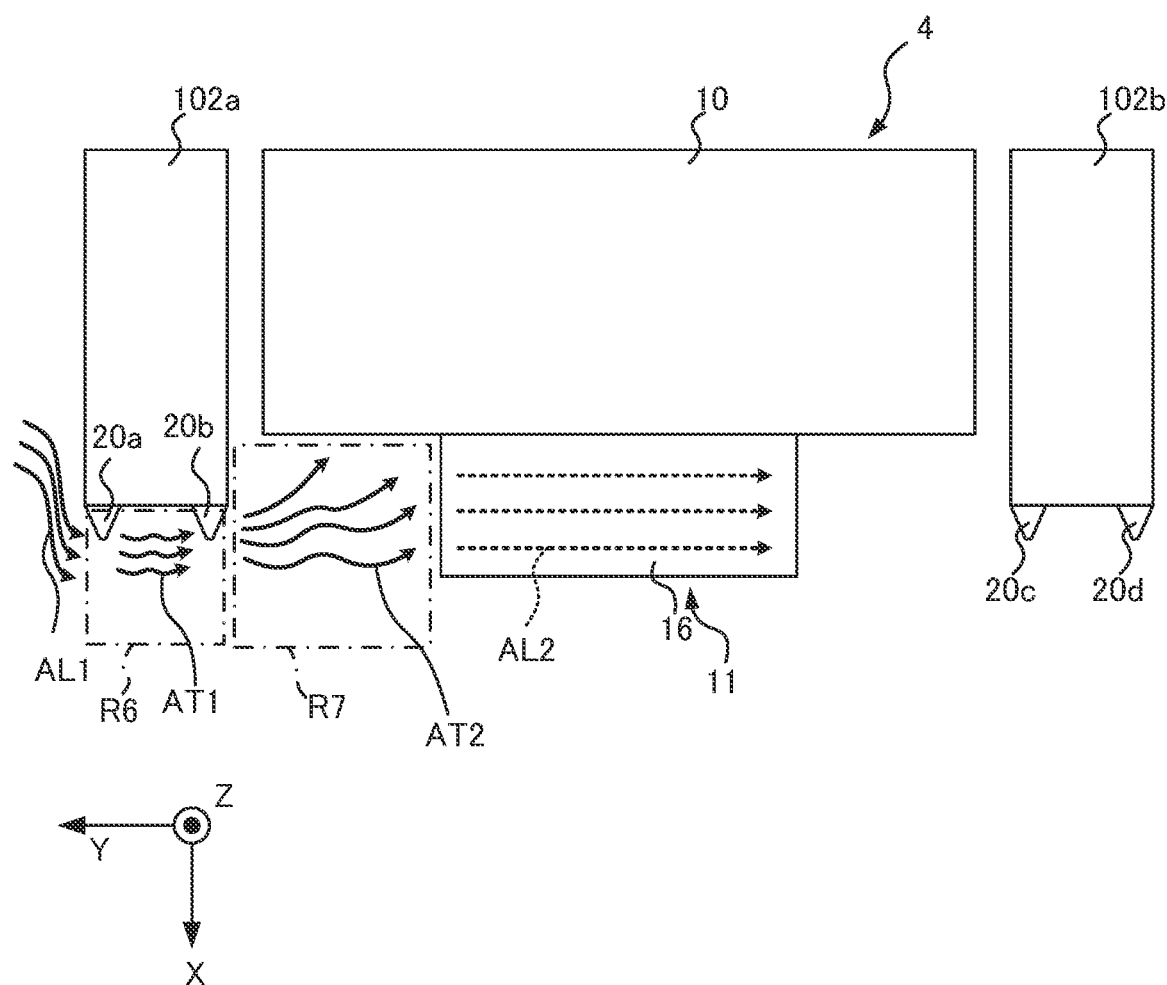
FIG. 17 is a diagram illustrating an airflow around the in-vehicle device according to Embodiment 4.

FIG. 17 illustrates the flow of the passing air around the in-vehicle device 4. The figure is viewed in the same manner as FIG. 7. For ease of illustration, FIG. 17 does not illustrate the vents 17 in the cover 16 included in the cooler 11. The passing air flowing in the negative Y-direction forms a laminar flow AL1 near the device 102a. The laminar flow AL1 flowing around the device 102a forms a laminar boundary layer near the device 102a. With the turbulence generating members 20a near a corner of the device 102a, the passing air turns into turbulence AT1 in the area R6.

By the turbulence generating members 20a causing the turbulence AT1, in other words, by the passing air turning into the turbulence AT1, a turbulent boundary layer forms near the device 102a. As described in Embodiment 1, the turbulent boundary layer is less likely to separate than the laminar boundary layer. The turbulence AT1 thus reduces separation vortices.

The passing air as the turbulence AT1 thus flows along the device 102a in the negative Y-direction while repeatedly flowing away from and closer to the device 102a. When the passing air flowing in the negative Y-direction as described above hits the turbulence generating members 20b, turbulence AT2 occurs in the area R7.

A part of the passing air as the turbulence AT2 flows toward the housing 10, and a turbulent boundary layer forms near the housing 10. As described in Embodiment 1, the turbulent boundary layer is less likely to separate than the laminar boundary layer. The turbulence AT2 thus reduces separation vortices.

The passing air as the turbulence AT2 thus flows along the housing 10 in the negative Y-direction while repeatedly flowing away from and closer to the housing 10, and flows into the cover 16 through the vents 17 in the cover 16 included in the cooler 11. The passing air flown into the cover 16 passes between the multiple fins 15a in the heat dissipater 15 and is regulated to be a laminar flow AL2. The in-vehicle device 4 allows more passing air to flow into the cooler 11 than the in-vehicle device 8, improving the cooling performance.

Similarly, when the railway vehicle 100 travels in the negative Y-direction, passing air turned into turbulence with the turbulence generating members 20d flows along the device 102b in the positive Y-direction while repeatedly flowing away from and closer to the device 102b. The passing air turns into turbulence again with the turbulence generating members 20c, flows toward the housing 10, and flows into the cover 16 through the vents 17 in the cover 16 included in the cooler 11.

The turbulence generating members 20a to 20d are preferably located at positions corresponding to separation points at which separation vortices occur when the turbulence generating members 20a to 20d are not included as illustrated in FIG. 16. More specifically, as illustrated in FIG. 17, the turbulence generating members 20a are preferably located at the end in the positive Y-direction of the surface of the device 102a facing in the positive X-direction. The turbulence generating members 20b are preferably located at the end in the negative Y-direction of the surface of the device 102a facing in the positive X-direction. The turbulence generating members 20c are preferably located at the end in the positive Y-direction of the surface of the device 102b facing in the positive X-direction. The turbulence generating members 20d are preferably located at the end in the negative Y-direction of the surface of the device 102b facing in the positive X-direction.

As described above, in the in-vehicle device 4 according to Embodiment 4, turbulence occurs with the turbulence generating members 20a to 20d attached to the devices 102a and 102b attached to the railway vehicle 100, suppressing separation vortices and allowing passing air to flow into the cooler 11. More air can thus flow into the cooler 11.

Embodiments of the present disclosure are not limited to the embodiments described above. The embodiments described above may be combined as appropriate. In one example, the in-vehicle device 1 may further include, similarly to the in-vehicle device 3, the turbulence generating members 19a to 19d attached to an outer surface of the cooler 11. In another example, the in-vehicle devices 1 to 3 may each include, similarly to the in-vehicle device 4, the turbulence generating members 20a to 20d attached to the devices 102a and 102b. In another example, the in-vehicle devices 1, 3, and 4 may each include, similarly to the in-vehicle device 2, the airflow regulating members 18a and 18b.

In the above embodiments, being attached includes being integral. In one example, the heat-receiving block 14 may be integral with the heat dissipater 15. Providing the heat-receiving block 14 integrally with the heat dissipater 15 achieves more efficient transfer of heat generated by the electronic components 13 to passing air through the heat-receiving block 14 and the heat dissipater 15.

In another example, the housing 10 may be integral with the turbulence generating members 12a and 12b. More specifically, protrusions and indentations formed by pressing the housing 10 may be the turbulence generating members 12a and 12b.

In another example, the cover 16a may be integral with the turbulence generating members 19a and 19b. More specifically, protrusions and indentations formed by pressing the cover 16a may be the turbulence generating members 19a and 19b. Similarly, the cover 16b may be integral with the turbulence generating members 19c and 19d.

Figure 18:
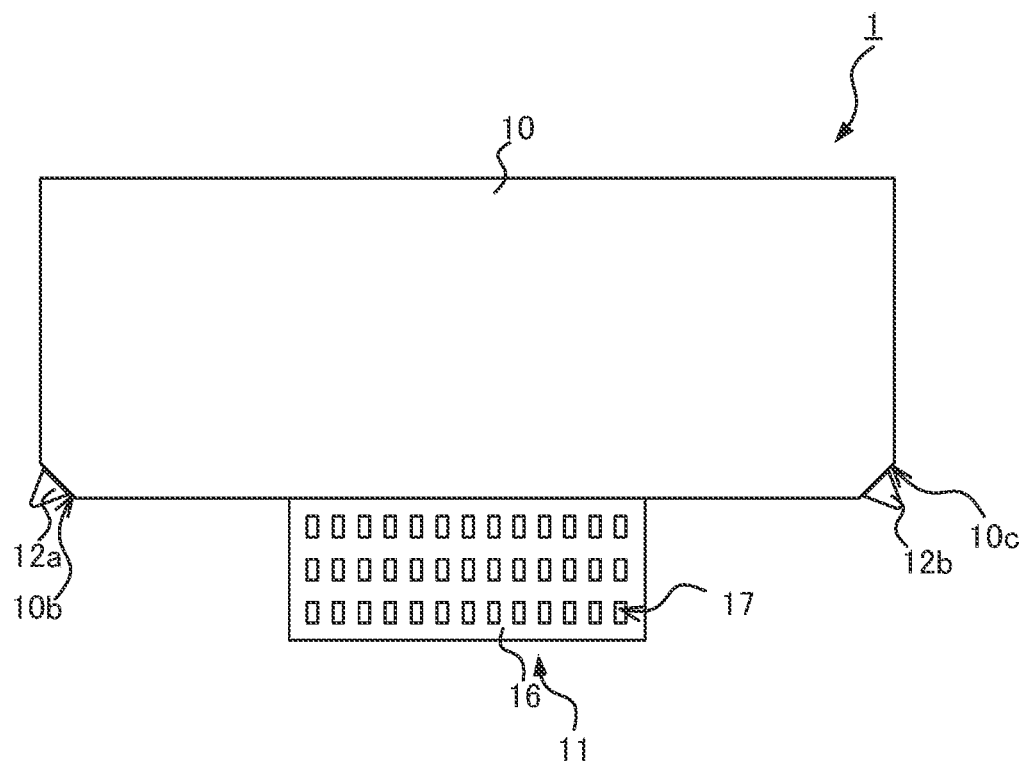
FIG. 18 is a top view of an in-vehicle device according to a first modification of one or more embodiments.

The turbulence generating members 12a, 12b, 19a to 19d, and 20a to 20d may be attached at any positions not limited to the examples in the above embodiments. The turbulence generating members 12a, 12b, 19a to 19d, and 20a to 20d may have any positions that can partly interrupt the flow of passing air and partly guide the remaining passing air along any of the in-vehicle devices 1 to 4 to cause turbulence. In one example, as illustrated in FIG. 18, the turbulence generating members 12a may be attached to a surface 10b being a chamfered corner of the housing 10. The turbulence generating members 12b may be attached to a surface 10c being a chamfered corner of the housing 10.

In another example, the turbulence generating members 12a and 12b may be attached to the surface of the housing 10 facing in the positive Z-direction or in the negative Z-direction. In another example, the turbulence generating members 12a and 12b may be attached to the surfaces of the housing 10 facing in the positive Y-direction and in the negative Y-direction.

In another example, the turbulence generating members 19a to 19d may be attached to surfaces being chamfered corners of the covers 16a and 16b. In another example, the turbulence generating members 19a to 19d may be attached to the surfaces of the covers 16a and 16b facing in the positive Z-direction or in the negative Z-direction. In another example, the turbulence generating members 19a to 19d may be attached to the surfaces of the covers 16a and 16b facing in the positive Y-direction and in the negative Y-direction.

In another example, the turbulence generating members 20a to 20d may be attached to surfaces being chamfered corners of the housings of the devices 102a and 102b. In another example, the turbulence generating members 20a to 20d may be attached to the surfaces of the devices 102a and 102b facing in the positive Z-direction or in the negative Z-direction. In another example, the turbulence generating members 20a to 20d may be attached to the surfaces of the devices 102a and 102b facing in the positive Y-direction and in the negative Y-direction.

Figure 19:
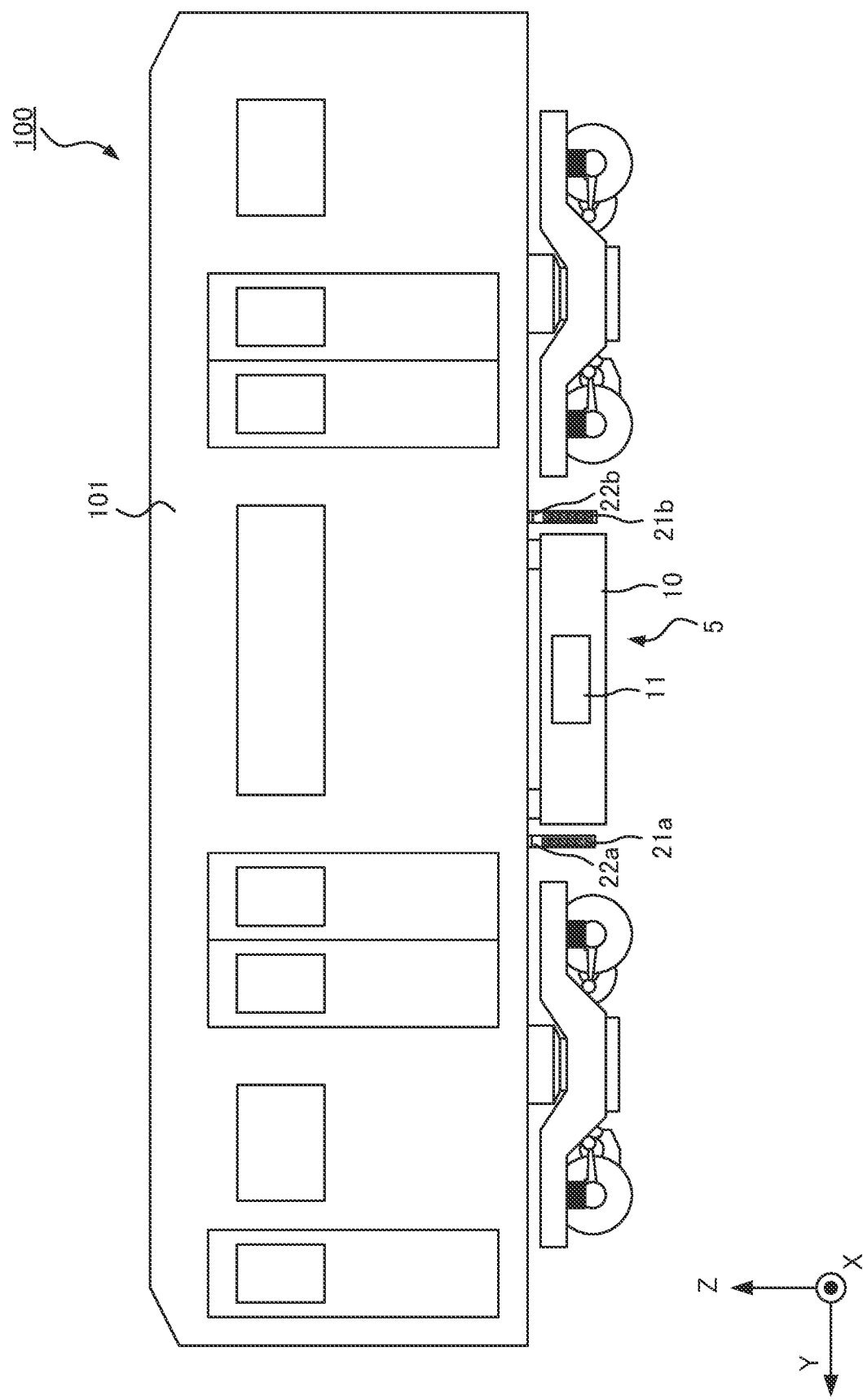
FIG. 19 is a side view of a railway vehicle incorporating an in-vehicle device according to a second modification of one or more embodiments.

In another example, as illustrated in FIGS. 19 and 20, an in-vehicle device 5 may include turbulence generating members 21a and turbulence generating members 21b attached to the vehicle body 101. The shape and the material of the turbulence generating members 21a and 21b are the same as the shape and the material of the turbulence generating members 12a and 12b included in the in-vehicle device 1 according to Embodiment 1. The turbulence generating members 21a are attached to a plate member 22a attached to the vehicle body 101. The turbulence generating members 21b are attached to a plate member 22b attached to the vehicle body 101. The plate members 22a and 22b are attached to the vehicle body 101 with, for example, fasteners. The plate members 22a and 22b may be attached to the vehicle body 101 firmly enough to maintain constant positional relationships relative to the vehicle body 101 under vibrations from the railway vehicle 100 that is traveling. More specifically, the plate members 22a and 22b are attached to the vehicle body 101 with an attaching method such as fitting, brazing, welding, attaching with an adhesive, or fastening with a fastener.

The turbulence generating members 21a and 21b have the same shape, and the plate members 22a and 22b have the same shape. FIG. 20 illustrates the plate member 22a to which the multiple turbulence generating members 21a are attached. As illustrated in FIG. 20, the turbulence generating members 21a are arranged in Z-direction and attached to the L-shaped plate member 22a.

The turbulence generating members 12a, 12b, 19a to 19d, 20a to 20d, 21a, and 21b may have any shape not limited to the examples in the above embodiments that can partly interrupt the flow of passing air to cause turbulence. In one example, the turbulence generating members 12a, 12b, 19a to 19d, 20a to 20d, 21a, and 21b may be triangular pyramids or circular cones with chamfered vertices.

In another example, the turbulence generating members 12a, 12b, 19a to 19d, 20a to 20d, 21a, and 21b may be frustums. More specifically, as illustrated in FIG. 21, the turbulence generating members 12a and 12b may be truncated square pyramids. The turbulence generating members 12a and 12b have the same shape. The turbulence generating members 12a are illustrated in FIG. 22. As illustrated in FIGS. 21 and 22, the turbulence generating members 12a are truncated square pyramids with the bottom surfaces attached to the housing 10.

Figure 23:
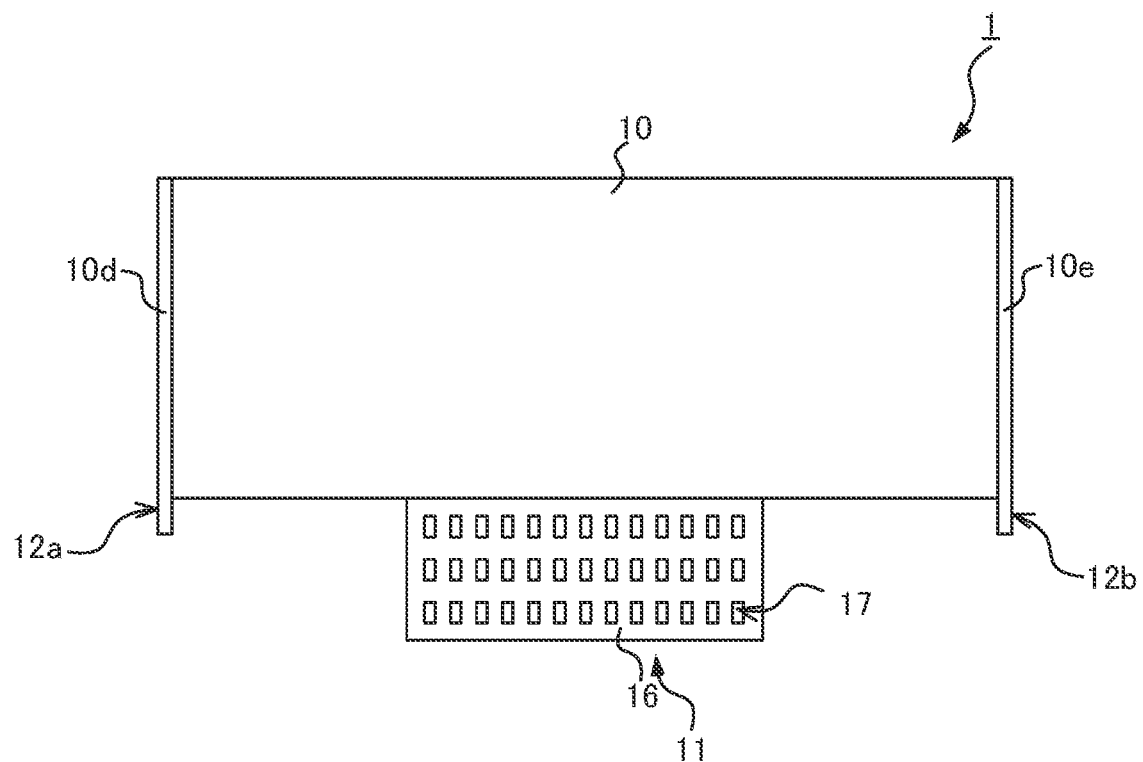
FIG. 23 is a top view of an in-vehicle device according to a fourth modification of one or more embodiments.
Figure 24:
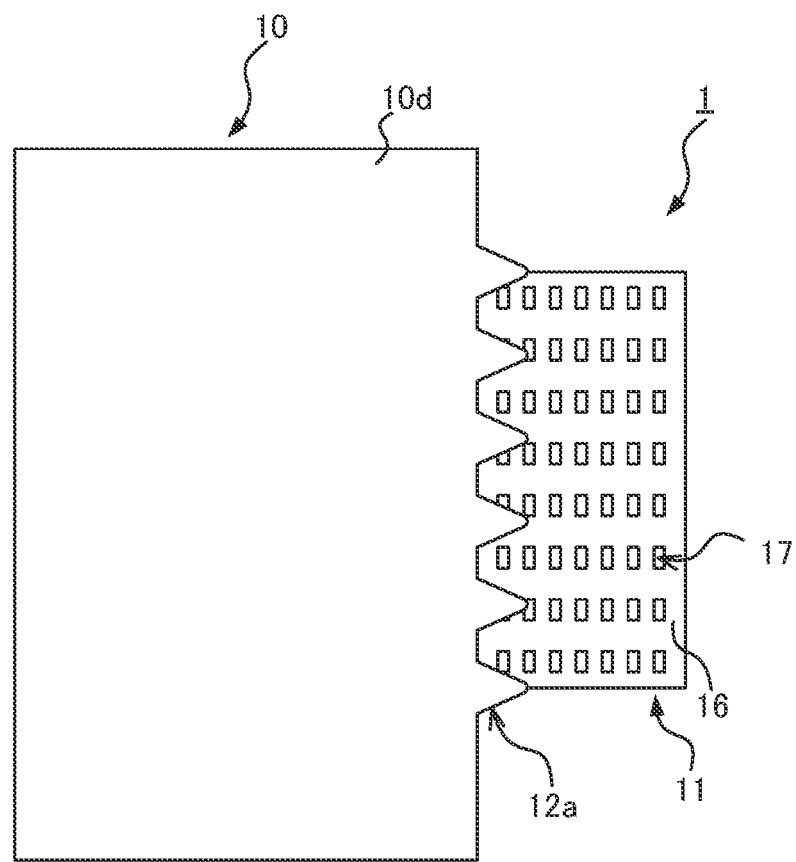
FIG. 24 is a front view of the in-vehicle device according to the fourth modification of one or more embodiments.

In another example, the turbulence generating members 12a, 12b, 19a to 19d, 20a to 20d, 21a, and 21b may be plates. More specifically, as illustrated in FIG. 23, the turbulence generating member 12a may be a portion of a plate member 10d, and the turbulence generating member 12b may be a portion of a plate member 10e, with the main surfaces intersecting with Y-axis and being portions of the housing 10. The turbulence generating members 12a and 12b have the same shape. The turbulence generating members 12a are illustrated in FIG. 24. As illustrated in FIG. 24, the plate member 10d includes protrusions and indentations at one end. The end of the plate member 10d with protrusions and indentations serves as the turbulence generating members 12a. Similarly, one end of the plate member 10e with protrusions and indentations serves as the turbulence generating members 12b.

Figure 26:
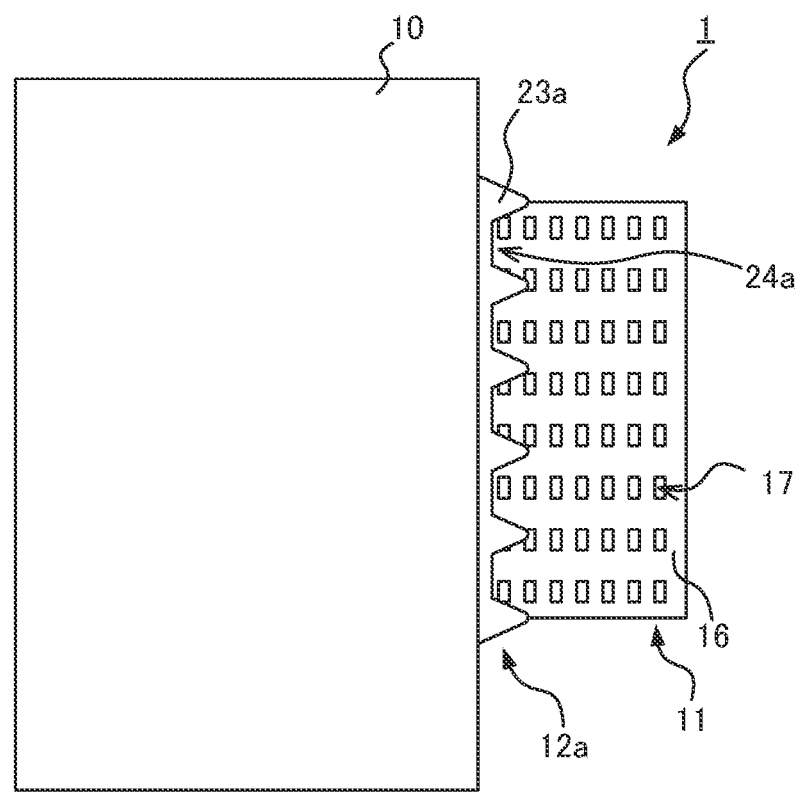
FIG. 26 is a front view of the in-vehicle device according to the fifth modification of one or more embodiments.

In another example, the turbulence generating members 12a, 12b, 19a to 19d, 20a to 20d, 21a, and 21b may have a columnar shape with cutouts. More specifically, as illustrated in FIG. 25, the turbulence generating members 12a may be columnar members 23a having a shape of triangular prism with cutouts 24a and having one surface attached to the housing 10. The turbulence generating members 12b may be columnar members 23b having a shape of a triangular prism with cutouts 24b and having one surface attached to the housing 10. A top view of the turbulence generating members 12a and 12b being the columnar members 23a and 23b is the same as the view in FIG. 2. The columnar members 23a and 23b have the same shape. The columnar member 23a is illustrated in FIG. 26. As illustrated in FIG. 26, the columnar member 23a has the cutouts 24a in a portion distant from the housing 10. The columnar members 23a and 23b are not limited to triangular prisms and may be any polygonal prisms. The shapes of the cutouts 24a and 24b are not limited to the example in FIGS. 25 and 26 and may be any shapes that can guide a part of passing air along the housing 10.

In another example, the fins 15a may include fins 15a extending through the cover 16a or the cover 16b. Portions of the fins 15a protruding through the cover 16a or the cover 16b may serve as the turbulence generating members 19a to 19d.

The in-vehicle device 1 and the in-vehicle device 2 may each include at least the turbulence generating members 12a or the turbulence generating members 12b. In one example, the in-vehicle device 1 and the in-vehicle device 2 may each include the turbulence generating members 12a but not turbulence generating members 12b. Similarly, the in-vehicle device 3 may include at least the turbulence generating members 19a, the turbulence generating members 19b, the turbulence generating members 19c, or the turbulence generating members 19d. In one example, the in-vehicle device 3 may include the turbulence generating members 19b and the turbulence generating members 19c, but not the turbulence generating members 19a or the turbulence generating members 19d. Similarly, the in-vehicle device 4 may include at least the turbulence generating members 20a, the turbulence generating members 20b, the turbulence generating members 20c, or the turbulence generating members 20d. Similarly, the in-vehicle device 5 may include at least the turbulence generating members 21a or the turbulence generating members 21b.

The heat dissipater 15 may have any structure that can dissipate heat transferred from the electronic components 13 to passing air through the heat-receiving block 14. In one example, the heat dissipater 15 may be attached to the heat-receiving block 14 and include multiple heat pipes containing coolant and multiple fins attached to the multiple heat pipes.

Each of the in-vehicle devices 1 to 5 is not limited to a power converter that converts power supplied from an overhead wire to three-phase AC power to be supplied to a main electric motor, and may be any device including heating elements and mountable on a railway vehicle. For example, the housing 10 may contain a transformer.

The housing 10 may be attached to a roof of the vehicle body 101. The housing 10 may be attached to the vehicle body 101 in a direction not limited to the example in the above embodiments. In one example, the in-vehicle devices 1 to 5 may each be attached to the vehicle body 101 with the opening 10a facing in the negative Z-direction. In another example, the in-vehicle devices 1 to 5 may each be attached to the vehicle body 101 with the opening 10a facing in the positive Z-direction.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST 1, 2, 3, 4, 5, 6, 7, 8 In-vehicle device
10, 60, 70, 80 Housing
10a Opening
10b, 10c Surface
10d, 10e, 22a, 22b Plate member
11, 11a, 11b, 61, 71a, 71b, 81 Cooler
12a, 12b, 19a, 19b, 19c, 19d, 20a, 20b, 20c, 20d, 21a, 21b Turbulence generating member
13 Electronic component
14 Heat-receiving block
14a First main surface
14b Second main surface
15 Heat dissipater
15a Fin
16, 16a, 16b Cover
17, 17a, 17b Vent
18a, 18b Airflow regulating member
23a, 23b Columnar member
24a, 24b Cutout
100 Railway vehicle
101 Vehicle body
102a, 102b Device
AL1, AL2, AL3 Laminar flow
AS1, AS2, AS3, AS4 Separation vortex
AT1, AT2, AT3, AT4 Turbulence
R1, R2, R3, R4, R5, R6, R7 Area

The invention claimed is:

1. An in-vehicle device, comprising:
a housing attachable to a railway vehicle and accommodating an electronic component that generates heat;
one or more coolers attached to and located outside the housing, with the one or more coolers thermally connected to the electronic component, the one or more coolers being configured to dissipate, from a heat dissipater, heat transferred from the electronic component to passing air occurring when the railway vehicle travels; and
one or more turbulence generating members on a flow path of the passing air, the one or more turbulence generating members being separate from the heat dissipater of the one or more coolers and configured to cause turbulence by partly interrupting a flow of the passing air flowing to at least one of the one or more coolers,
at least one of the one or more turbulence generating members is attached to the housing directly, spaced from the one or more coolers on a surface of the housing to which the one or more coolers are attached, wherein
each of the one or more coolers includes
a heat-receiving block with a first main surface to which the electronic component is attachable and a second main surface opposite to the first main surface,
a heat dissipater provided outside the housing, with the heat dissipater thermally connected to the heat-receiving block, the heat dissipater being configured to dissipate heat transferred from the electronic component through the heat-receiving block to the passing air flowing nearby, and
a cover covering the heat dissipater and having vents through which the passing air flows in or the passing air flown in flows out.

2. The in-vehicle device according to claim 1, further comprising:
one or more airflow regulating members on the flow path of the passing air and between one of the one or more coolers and one of the one or more turbulence generating members, the one or more airflow regulating members being configured to regulate the passing air.

3. The in-vehicle device according to claim 2, wherein
the one or more airflow regulating members have a shape of a plate with a main surface parallel to a traveling direction of the railway vehicle.

4. The in-vehicle device according to claim 1, wherein
the one or more turbulence generating members include a plurality of turbulence generating members, and at least two of the plurality of turbulence generating members are attached to an outer surface of the housing, with the one or more coolers placed between the at least two of the plurality of turbulence generating members in a traveling direction of the railway vehicle.

5. The in-vehicle device according to claim 4, wherein
at least two of the plurality of turbulence generating members are attached to the outer surface of the housing at both ends of the outer surface in the traveling direction of the railway vehicle, the outer surface of the housing being a face that intersect with a width direction of the railway vehicle.

6. The in-vehicle device according to claim 4, wherein the at least two of the plurality of turbulence generating members attached to the outer surface of the housing are integral with the housing.

7. The in-vehicle device according to claim 1, wherein the one or more coolers include a plurality of coolers spaced from one another in a traveling direction of the railway vehicle, and
the one or more turbulence generating members include a plurality of turbulence generating members, and turbulence generating members of the plurality of turbulence generating members are attached to outer surfaces of the plurality of coolers.

8. The in-vehicle device according to claim 1, wherein the one or more turbulence generating members include a plurality of turbulence generating members, and at least two of the plurality of turbulence generating members are attached to an outer surface of each of the one or more coolers at both ends of the outer surface in a traveling direction of the railway vehicle, the outer surface of each of the one or more coolers being a face that intersects with a width direction of the railway vehicle.

9. The in-vehicle device according to claim 1, wherein the one or more turbulence generating members include a plurality of turbulence generating members, and at least one of the plurality of turbulence generating members is attached to an outer surface of the cover of each of the one or more coolers.

10. The in-vehicle device according to claim 9, wherein the at least one of the plurality of turbulence generating members attached to the outer surface of the cover is integral with the cover.

11. The in-vehicle device according to claim 1, wherein the one or more turbulence generating members have a shape of a cone.

12. The in-vehicle device according to claim 11, wherein the cone has a chamfered vertex.

13. The in-vehicle device according to claim 1, wherein the one or more turbulence generating members have a shape of a frustum.

14. The in-vehicle device according to claim 1, wherein the one or more turbulence generating members have a shape of a plate.

15. An in-vehicle device, comprising:
a housing attachable to a railway vehicle and accommodating an electronic component that generates heat;
one or more coolers attached to and located outside the housing, with the one or more coolers thermally connected to the electronic component, the one or more coolers being configured to dissipate, from a heat dissipater, heat transferred from the electronic component to passing air occurring when the railway vehicle travels; and
one or more turbulence generating members on a flow path of the passing air, the one or more turbulence generating members being separate from the heat dissipater of the one or more coolers and configured to cause turbulence by partly interrupting a flow of the passing air flowing to at least one of the one or more coolers,
at least one of the one or more turbulence generating members is attached to the housing directly, spaced from the one or more coolers on a surface of the housing to which the one or more coolers are attached, wherein
at least one of the one or more turbulence generating members is located outside the housing and adjacent to the housing.

16. The in-vehicle device according to claim 15, wherein the at least one of the one or more turbulence generating members is attached to a vehicle body of the railway vehicle.

17. The in-vehicle device according to claim 10, wherein the at least one of the one or more turbulence generating members is attached to an outer surface of a device mountable on the railway vehicle.

18. An in-vehicle device, comprising:
a housing attachable to a railway vehicle and accommodating an electronic component that generates heat;
one or more coolers attached to and located outside the housing, with the one or more coolers thermally connected to the electronic component, the one or more coolers being configured to dissipate, from a heat dissipater, heat transferred from the electronic component to passing air occurring when the railway vehicle travels; and
one or more turbulence generating members on a flow path of the passing air, the one or more turbulence generating members being separate from the heat dissipater of the one or more coolers and configured to cause turbulence by partly interrupting a flow of the passing air flowing to at least one of the one or more coolers,
at least one of the one or more turbulence generating members is attached to the housing directly, spaced from the one or more coolers on a surface of the housing to which the one or more coolers are attached, wherein
the one or more turbulence generating members have a columnar shape with a cutout.

* * * * *